United States Patent [19]

Fulkerson

[11] 4,165,470
[45] Aug. 21, 1979

[54] LOGIC GATES WITH FORWARD BIASED DIODE LOAD IMPEDENCES

[75] Inventor: David E. Fulkerson, Minnetonka, Minn.

[73] Assignee: Honeywell Inc., Minneapolis, Minn.

[21] Appl. No.: 724,791

[22] Filed: Sep. 20, 1976

[51] Int. Cl.[2] ...................... H03K 19/08; H01L 27/04
[52] U.S. Cl. ................................... 307/215; 307/213; 307/317 A; 357/15; 357/46; 357/51
[58] Field of Search ............... 307/215, 317 A, 317 R; 357/15, 51, 46

[56] References Cited

U.S. PATENT DOCUMENTS

| 3,631,309 | 12/1971 | Myers | 357/51 |
| 3,699,362 | 10/1972 | Jordan | 307/317 A |
| 3,869,622 | 3/1975 | Shimizu | 357/15 |
| 3,987,310 | 10/1976 | Peltier et al. | 307/313 |

OTHER PUBLICATIONS

Schuenmann et al., "Schottky-diistor Logic", IBM Tech. Discl. Bulletin, vol. 15, No. 2, Jul. 1972, pp. 509–510.
Designing with TTL Integrated Circuits, (Morris et al., Eds.) (McGraw-Hill, N. Y., 1971), pp. 19 and 21.
Fulkerson, "Direct-Coupled Transistor-Transistor Logic . . .", IEEE J. Solid-State Circuits, Apr. 1975 (vol. SC 10, No. 2), pp. 110–117.
Ho et al., "Bipolar Dynamic Logic", IBM Technical Discl. Bull., vol. 14, No. 4, Sep. 1971, p. 1037.

Primary Examiner—William D. Larkins
Attorney, Agent, or Firm—Theodore F. Neils

[57] ABSTRACT

A logic family is provided capable of accomplishing a logic function for each transistor used, i.e., one transistor per logic gate. A plurality of logic gate types are shown, each capable of a different logic function. Nonlinear loads are used in the logic gate circuits.

34 Claims, 24 Drawing Figures

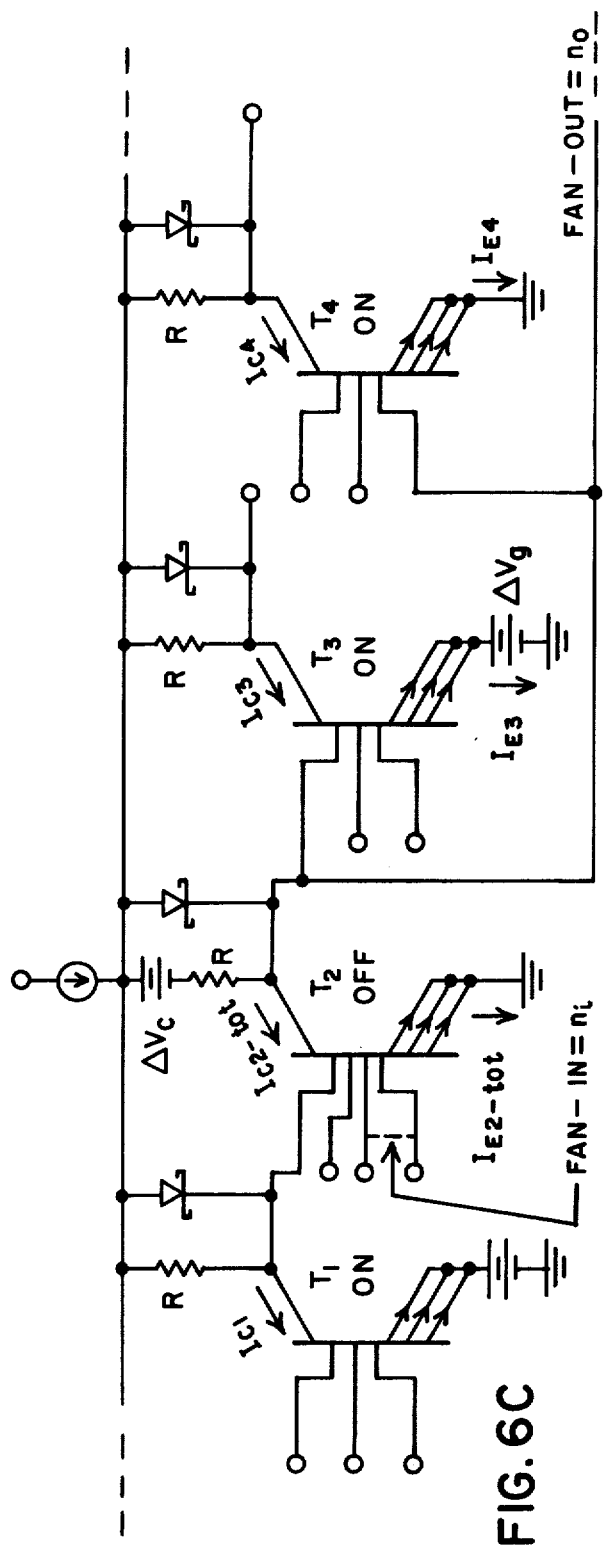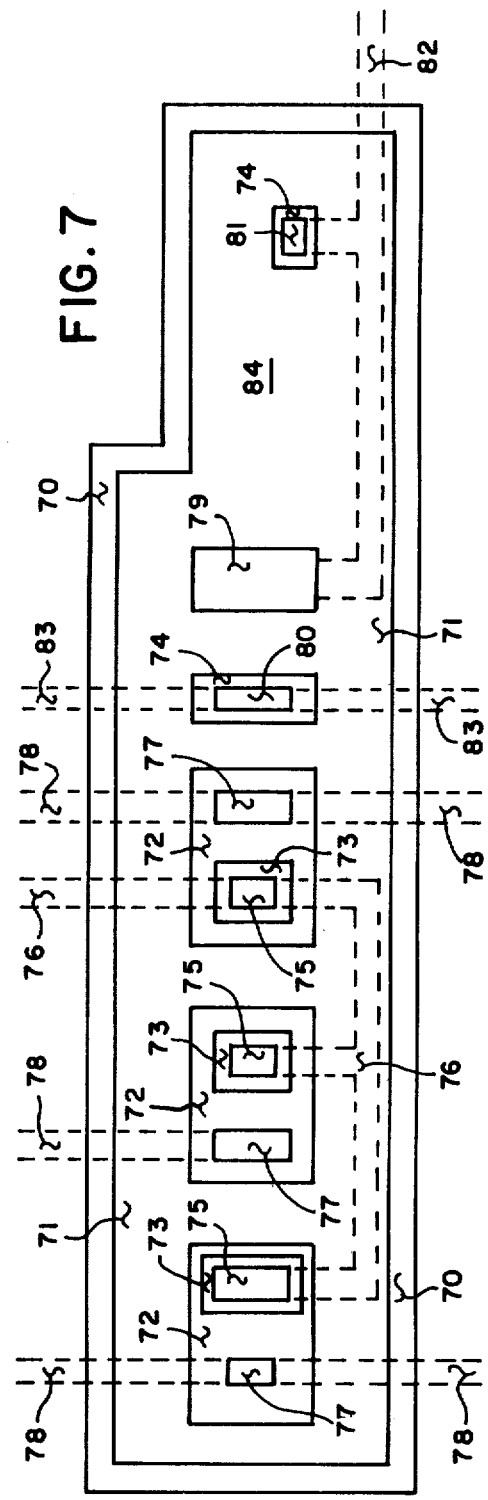
FIG. 6C
FIG. 7

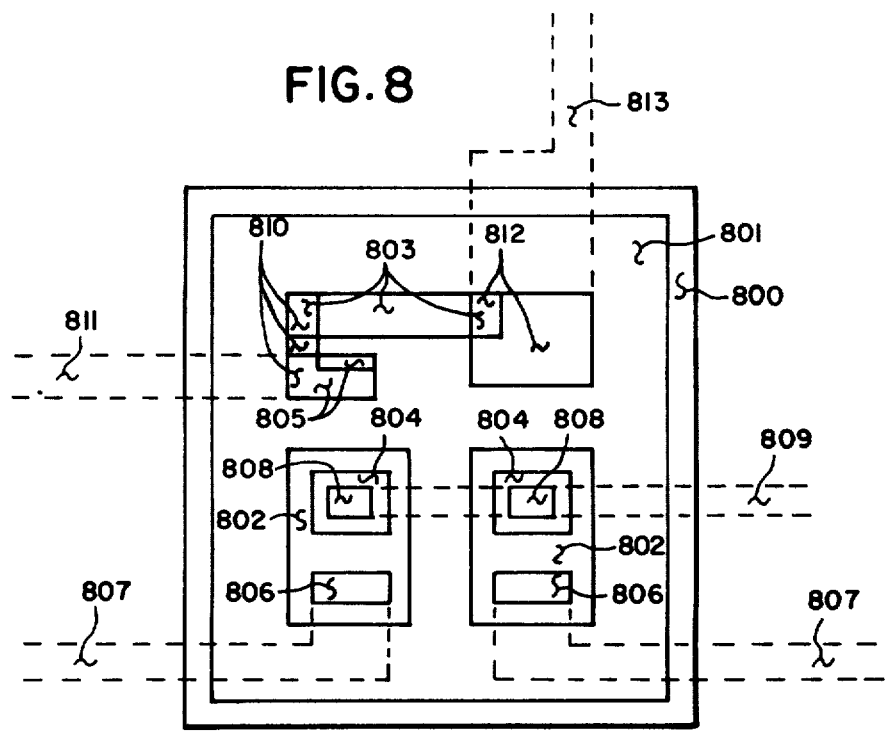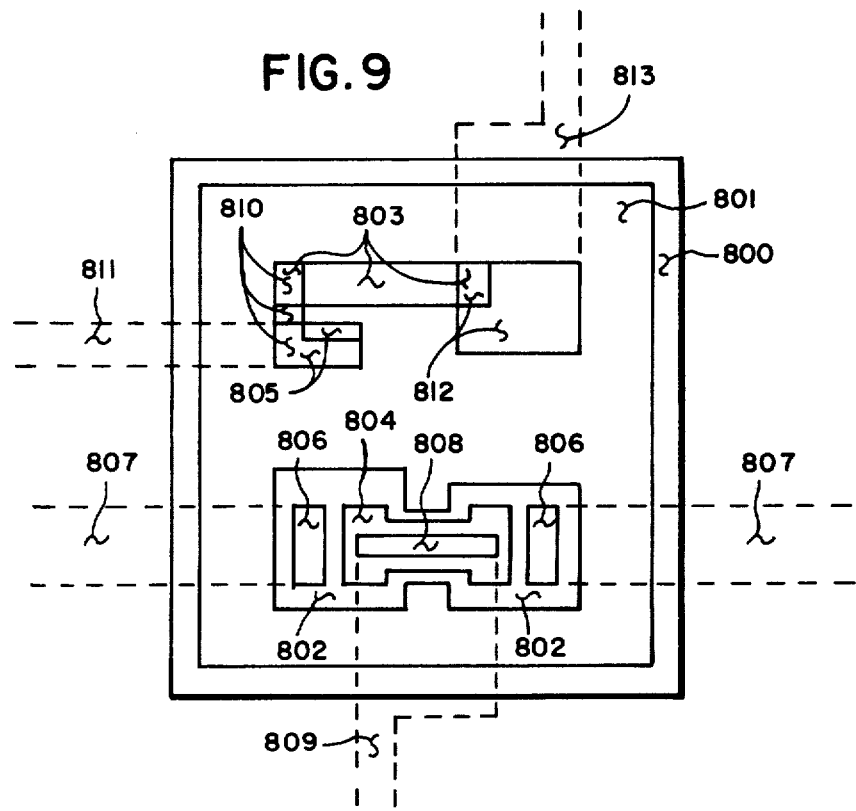

LOGIC GATES WITH FORWARD BIASED DIODE LOAD IMPEDENCES

BACKGROUND OF THE INVENTION

This invention relates to apparatus for providing circuits as logic gates to perform logical functions in combinational and sequential switching logic systems. Moreover, these logic gate circuits can be particularly advantageously provided as monolithic integrated circuits.

The advent of large scale integration has meant that monolithic integrated circuits are becoming available with more and more digital system functions provided therein to the point that substantial portions of many digital systems are provided on a single chip. This increase in functional density and so in circuit density in a monolithic integrated circuit has several advantages. Substantial economies are realized in reduced assembly costs, etc. Improved reliability results because fewer interconnections are needed to be made among the devices making up the system. There is an increase in the rapidity of operations since the signals which must be transmitted in the system need only be transmitted over small distances.

These advantages and others motivate the desire to increase the number of logic gates in a monolithic integrated circuit chip to further increase the logic function density, and so increase the portions of digital systems provided in such a device. Additionally, for the purpose of accomplishing more rapidly the logic functions to be performed to thereby improve the digital system capabilities, increasing the rapidity of operation of the logic gates used in the monolithic integrated circuit device is also very desirable. Yet, both increases in circuit density and in the rapidity of circuit searching operations tend to also increase the power dissipated in a monolithic integrated circuit device. Hence, the method chosen to reach these two goals must also provide for achieving a sufficiently low power dissipation if a viable monolithic integrated circuit device is to be realized.

Currently, the need for rapidly operating digital monolithic integrated circuit devices is most commonly met by transistor-transistor logic circuits (TTL), particularly Schottky-clamped TTL, and emitter-coupled logic (ECL). The logic gates provided in these logic families tend to use on the average more than one transistor per logic function accomplished. Use of one transistor per logical function would be quite desirable since the use of further transistors tends to require more space in a monolithic integrated circuit, tends to slow operation of the logic gate and tends to increase power consumption.

There have been attempts to develop new logic circuits to improve on the foregoing logic circuit families and to develop new logic families. Among these is a logic circuit shown in U.S. Pat. No. 3,769,524 to Mathews which teaches use of a NOR gate to perform logical functions. The circuitry shown in this patent teaches a somewhat simplified logic gate requiring relatively little power but still shows use of more than one transistor on the average in achieving the NOR logic function provided.

A substantial further improvement along these lines is shown in U.S. Pat. No. 3,970,866 to the present inventor and assigned to the present assignee. There is shown logic gate circuits having but one transistor per logic function and which can operate at a relatively low voltage to increase rapidity of operation and reduce power dissipation. Nevertheless, further improvements in density and reduced operating voltage are desirable.

SUMMARY OF THE INVENTION

The present invention uses nonlinear circuit component loads to eliminate resistive loads to thereby reduce the amount of semiconductor material required for a logic gate circuit while maintaining a rapid switching operability and in some instances to reduce the operating voltage required and to reduce power consumption per logic gate. Use of such nonlinear circuit component loads is compatible with the accomplishing of a basic logical function per each transistor used, although a logic gate circuit is shown which requires more than a single transistor for the logic function provided because this logic gate may be useful in certain circumstances. Further, these logic gate circuits are well suited to being provided in the form of a monolithic integrated circuit as the entire logic gate in several instances can be provided in a single isolated region in the monolithic integrated circuit and in a form to facilitate logic gate layouts therein due to the convenient logic gate interconnections permitted. Also, the logic family of the present invention allows connection to logic gates in other logic families with little difficulty and without requiring substantial additional, complicated circuitry.

BRIEF DESCRIPTION OF THE DRAWINGS

FIGS. 7, 8 and 9 show monolithic integrated circuit embodiments of the invention, FIGS. 10A and B show another circuit embodiment of the present invention.

DESCRIPTION OF THE PREFERRED EMBODIMENTS

Figure 1:
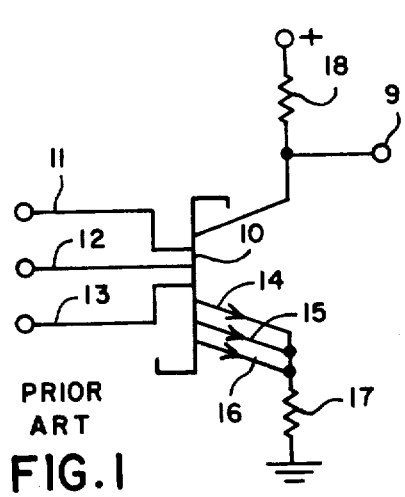
FIG. 1 shows a prior art logic gate circuit.

FIG. 1 shows a prior art circuit diagram for a logic gate circuit for performing a NOR logical function which is constructed using a multiple-base and a multiple-emitter bipolar transistor, 10, wherein there is an emitter formed in each of several separate bases which are provided commonly in a collector region, these emitters being internally shorted. Thus, effectively, a multiple-base transistor is provided. Transistor 10 has three base leads extending from these bases, base leads 11, 12 and 13, and three leads from the corresponding emitters, emitter leads 14, 15 and 16. Base leads 11, 12 and 13 serve as inputs to receive logic signals from sources of such signals typically some other logic gate preceding the gate of FIG. 1.

An emitter circuit resistor, 17, is connected between ground and the joined emitter leads of transistor 10 to reduce "current-hogging" which occurs between the various base and emitter combinations present in transistor 10, i.e. base-emitter combination 11 and 14, base-emitter combination 12 and 15, and base-emitter combination 13 and 16. The use of resistor 17 reduces the "current-hogging" problem which plagued the old DCTL logic family.

A collector circuit load resistor, 18, connected between a positive voltage supply and the collector of transistor 10 is used to provide the voltage swing at the NOR gate output, 9, in response to input signals occurring at base leads 11, 12 or 13. Transistor 10 is shown as a Schottky diode-clamped transistor, or Schottky transistor, which has a Schottky diode connected from each base therein to the collector (diode cathode being connected to the collector) to keep transistor 10 out of saturation so as to increase its switching rapidity.

The logic gate circuit of FIG. 1 is more fully taught in an above-mentioned reference, U.S. Pat. No. 3,970,866. A difficulty with the circuit of FIG. 1 in practical implementation in a monolithic integrated circuit is that resistor 17 cannot easily be formed in the same isolation region as is transistor 10. Thus, further space is required in the semiconductor material to provide an isolated region for forming thereon resistor 17 or thin film techniques must be used to provide the resistor on the monolithic integrated circuit structure, or the like.

Figure 2A:
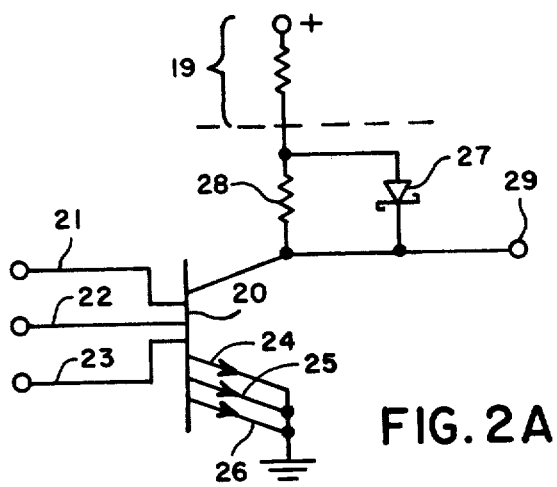
FIGS. 2A, B and C show a circuit embodiment of the present invention.

The circuit shown in FIG. 2A eliminates the use of an emitter resistor while still substantially avoiding the "current-hogging" problem inherent in the old DCTL logic family. This is accomplished by substituting a current source as the power source for the logic gate and by using a nonlinear circuit component as a clamping device across the collector circuit load resistor.

Thus, there is again provided a multiple-base and multiple-emitter bipolar transistor 20, wherein there is an emitter formed in each of several separate bases which are provided commonly in a collector region with again these emitters internally shorted. However, this time transistor 20 is not a Schottky transistor because the nonlinear circuit component in the collector load circuit eliminates the need for a Schottky diode clamp to keept transistor 20 out of saturation as is necessary for rapid switching operation. In fact, the use of a Schottky transistor for transistor 20 in FIG. 2A will actually slow switching rapidity because of the added capacitance introduced by placing a Schottky diode across the base-collector junction of transistor 20.

Transistor 20 is again arbitrarily shown with three base leads extending from the three bases therein, base leads 21, 22 and 23, and with three corresponding emitter leads, emitter leads 24, 25 and 26. Base leads 21, 22 and 23 serve as inputs to receive logic signals from sources of such signals which is usually another logic gate preceding the gate of FIG. 2A. Internally shorted emitter leads 24, 25 and 26 are jointly electrically connected to a relatively low voltage value voltage source shown here arbitrarily as ground.

A Schottky diode, 27, is connected between the collector of transistor 20 and a current source 19 separated from the logic gate circuit of FIG. 2A by a horizontal dashed line. The collector of transistor, 20, as connected to the cathode of Schottky diode 27, serves as the logic gate output, 29. Current source 19 is represented by a resistor in series with a relatively high voltage value voltage source which is represented in FIG. 2A by a terminal adapted for connection to such a voltage source.

A load resistor, 28, is provided in parallel across Schottky diode 27. The result is, that when the load current drawn through resistor 28 is sufficiently small, the presence of Schottky diode 27 has no effect as the voltage thereacross does not exceed the diode threshold voltage. On the other hand, the voltage drop across resistor 28 is limited to being not much more than this threshold voltage of Schottky diode 27, a situation which prevents transistor 20 from going into saturation as it turns on in response to signals on any of bases 21, 22 or 23 thus maintaining a rapid switching capability for transistor 20.

FIG. 2B again shows the circuit of the logic gate in FIG. 2A, but with a current source symbol, also marked 19 in FIG. 2B, provided in place of the current source representation of FIG. 2A. FIG. 2C shows the circuit diagram of another logic gate performing a NOR logical function using a multiple-base, bipolar transistor, 20', having multiple bases therein formed commonly in a collector region and having a single emitter region common to these multiple bases. The leads extending from the multiple bases are labeled 21', 22' and 23', respectively, corresponding to FIGS. 2A and 2B. The single emitter lead is marked 24'. Load resistor 28 and Schottky diode 27 and current source 19 all have the same characteristics and perform the same functions that were associated with them in FIGS. 2A and 2B.

Figure 2B:
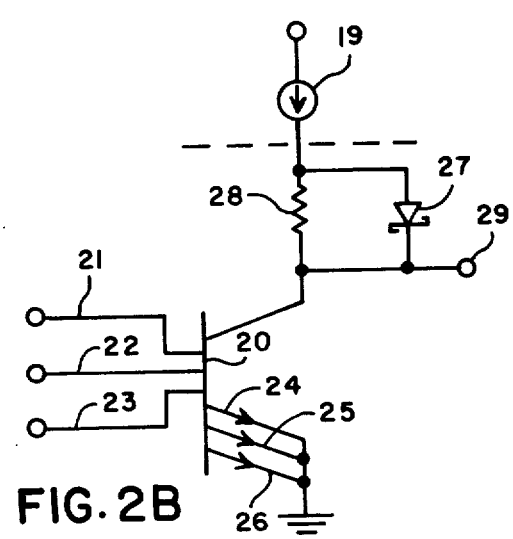
Figure 2C:
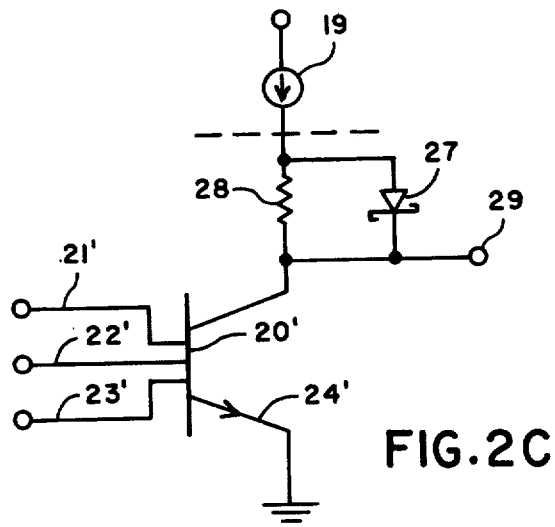

The advantages of the NOR gate circuit shown in FIG. 2C and those of the NOR gate circuit shown in FIGS. 2A and 2B, but also having the advantage of using a transistor that can be of even smaller physical size than the transistors used in these last mentioned Figures because just one emitter is used. Providing very many bases in a transistor of this kind is difficult, i.e. to provide a substantial fan-in, and some interaction inevitably occurs between such bases which must be strictly controlled in the logic gate circuit of FIG. 2C if that circuit is to operate effectively. An example indicating a technique of providing a somewhat similar transistor is shown in U.S. Pat. No. 3,569,800 to Collins.

Figure 3:
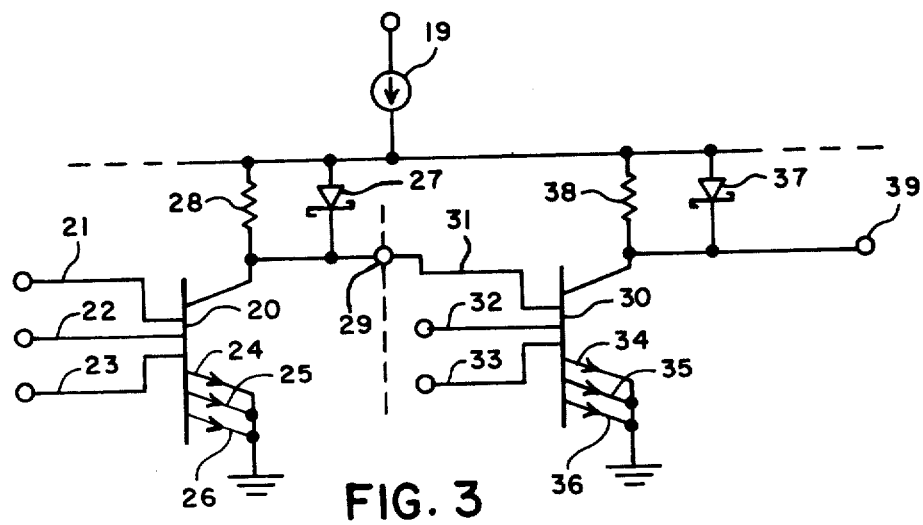
FIG. 3 shows a combination of FIG. 2A circuits.

As is well known, any Boolean logic function may be realized by the use of one or more levels of NOR logic gates without any resort to logic gates providing other kinds of Boolean logic functions. FIG. 3 shows two cascaded logic gate circuits separated by a vertical dashed line, each of which logic gate circuits represents a logic level so that two such levels are shown. The logic gate circuit chosen for the logic gates in FIG. 3 has been arbitrarily selected to be that of FIG. 2B. The left-hand logic gate circuit again uses the designations used in FIG. 2B while new designations are provided in the right-hand logic circuit of FIG. 3. In this latter circuit, there is provided a bipolar transistor, 30, having multiple-bases with leads thereto designated 31, 32 and 33 and having internally shorted multiple-emitters designated with leads thereto 34, 35 and 36. There is a Schottky diode, 37, connected between the collector of transistor 30 and current source 19. There is a load resistor, 38, across a Schottky diode, 37. The collector of transistor 30 serves as the right-hand logic gate output, 39.

As is well known, if transistor 20 is in the off condition so that output 29 of the left-hand logic gate circuit is in the high logic state, then transistor 30 will be in the on condition so that output 39 of the right-hand logic gate circuit is in the low logic state. Vice versa, if the left-hand logic gate circuit has transistor 20 in the on condition so that this logic gate circuit is in the low logic state viewed at output 29, then transistor 30 will be in an off condition so the right-hand logic gate circuit of FIG. 3 will be in the high state condition viewed at output 39. As a result of these complementary situations, most practical logic gate systems using the logic gate circuits of FIGS. 2B or 2C will have some logic gates in the high logic state and some logic gates in the low logic state, often with approximately half of the logic gates present in each logic state. With this being true, it follows in general and in particular for FIG. 3, that the voltage appearing at the output of current source 19 will be just slightly greater than the $V_{BE}$ drop of whichever of transistors 20 or 30 is in the on condition.

This can be seen, by way of example, by assuming transistor 20 to be in the off condition with transistor 30 therefore being in the on condition. The voltage drop from the output of current source 19 to ground consists of the voltage drop across the base-emitter junction associated with lead 31 of transistor 30 and the voltage drop across load resistor 28. The voltage drop across load resistor 28 will be quite small since, whatever the fan-out is from output 29, only base currents need to be supplied through load resistor 28. In the collector-emitter circuit or output circuit for transistor 30, the voltage drop across transistor 30 will adjust so that this voltage drop plus the voltage drop across Schottky diode 37 just equals the aforementioned voltage drop across load resistor 28 and across the pertinent base-emitter junction of transistor 30. This results in transistor 30 being kept out of saturation since the voltage drop across Schottky diode 37 will be less than that across the base-emitter junction of transistor 30 because of the differing threshold voltages associated with each.

This extremely low operating voltage across the logic gates of FIG. 3, in addition to the transistors therein being prevented from saturating, means rapid switching operation. This is because the stray capacitances in the circuit need only be charged to this low operating voltage. Further, there is relatively small power dissipation in a logic system using the logic gate circuits of FIG. 2 because of the low voltage drop across the logic gates. Rapid switching operation and low power dissipation are very desirable features for large scale integration in monolithic integrated circuits when coupled with a logic gate circuit requiring very little space in the semiconductor material used for the integrated circuit. This latter feature is provided by the logic gate circuits of FIG. 2 because of the multiple-base construction of the transistors used for these logic gates leading to needing, for these circuits, no further isolated regions when provided in a monolithic integrated circuit form beyond that in which the transistor for each gate is formed. That is, with the elimination of emitter resistors such as shown in FIG. 1, the logic gate circuits of FIG. 2 (and the individual logic gate circuits of FIG. 3) can each be provided in a single isolated region in a monolithic integrated circuit because both the load resistor and the Schottky diode in the collector circuit therein can be formed in a single isolated region along with the corresponding transistor. Construction of the logic gate in a single isolated region in a monolithic integrated circuit also improves switching rapidity since the stray and parasitic capacitances encountered per logic gate in monolithic integrated form are reduced.

Finally, concerning saving space in the semiconductor material in a monolithic integrated circuit, the total amount of resistance in the integrated circuit or the resistance per logic gate should be kept as small as possible since the amount of such resistance is strongly related to semiconductor material space needs. The amount of resistance required for logic systems constructed using the logic gates of FIG. 2 will be substantially less than that required for logic systems constructed using logic gates such as, for instance, that shown in FIG. 1 or those of the old DCTL logic family. This is because for the logic gate circuits of FIG. 2, the resistance required is proportional to the logic signal voltage range in switching while for the circuit of FIG. 1 the required resistance is proportional to the supply voltage which will be greater than the aforesaid logic signal voltage range. And should the voltage supply available to the integrated circuit for the purpose of operating the logic system therein, whether constructed of the logic gate circuits of FIG. 1 or of FIG. 2, be greater than the minimum value satisfactory for operating the circuit of FIG. 1 of approximately 1.5 volts (further discussed below), the advantage of less total resistance will be strongly in favor of the circuits of FIG. 2. This follows because the logic signal voltage range for the circuits of FIG. 2 remains the same (the added voltage being absorbed in the current source) while the supply voltage for the circuit of FIG. 1 is directly increased unless a voltage regulator is provided on the chip to decrease the voltage supplied to the logic gates therein.

Figure 4:
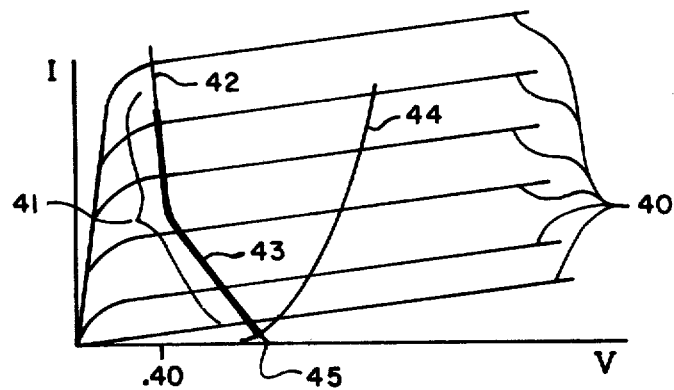
FIG. 4 shows a graph of the operation of a portion of the FIG. 3 circuit.

FIG. 4 shows along a pair of axes, I and V the various circuit component device characteristics which play a role in determining the operating conditions at output 29 in FIG. 3. The characteristics designated by the numeral 40 represent the common-emitter collector static characteristics for transistor 20. Curve 41 represents the joint static characteristics of the load components including Schottky diode 27 and load resistor 28. The portion of curve 41 above the knee therein is designated by the numeral 42 and is determined primarily by the individual forward volt-ampere characteristic of Schottky diode 27. Note that the knee in curve 41 occurs approximately at the logic gate operating voltage less the threshold voltage of Schottky diode 27, that is at approximately 0.4 volts. The portion of curve 41 below the knee, designated by numeral 43, is determined primarily by the individual characteristic of load resistor 28, i.e. the slope of the line portion 43 is approximately the negative of the conductance of load resistor 28. Curve 44 represents the forward volt-ampere characteristic of the base-emitter junction of transistor 30. Point 45 along the axis designated V in FIG. 4 represents approximately the voltage which occurs across current source 9 in FIG. 3, i.e. the logic gate operating voltage, which will be approximately 0.8 volts. The voltage at output 29 will approximately follow the path of the heavily darkened portion in FIG. 4 during operation of the circuit shown in FIG. 3.

Figure 5:
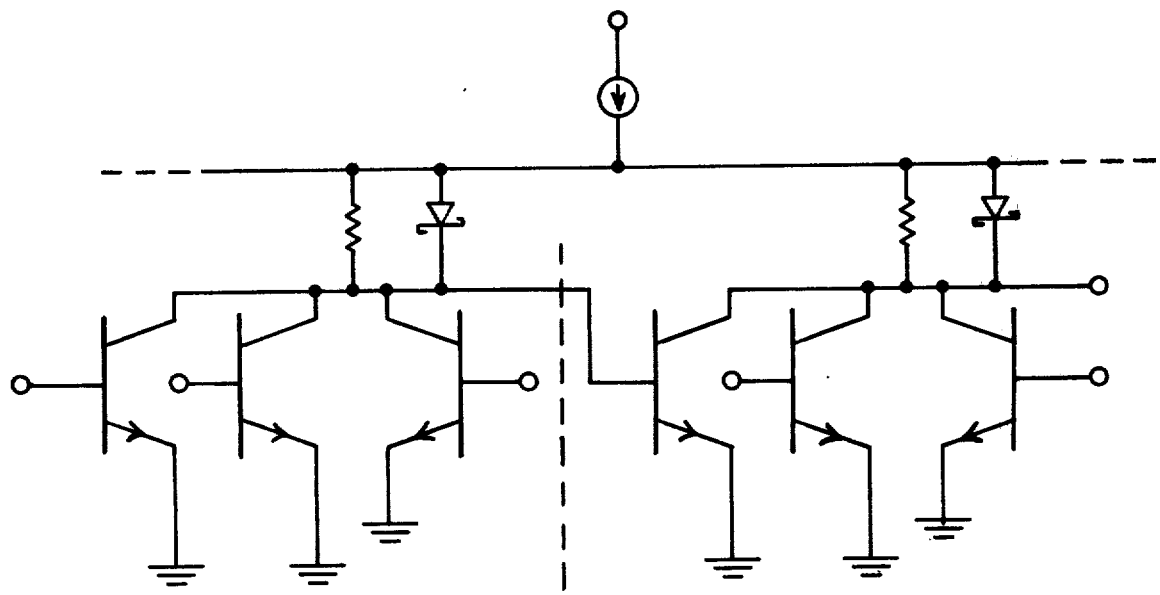
FIG. 5 shows a discrete device embodiment of the FIG. 3 circuit.

Of course, one is not confined to using multiple-base transistors despite the advantages of using such transistors especially in monolithic integrated circuits. Thus, there is shown in FIG. 5 a pair of logic gates on either side of the vertical dashed line therein which perform the same logic functions as do the logic gates in FIG. 3. Further, the same operating voltage will appear at the output of the current source supplying these logic gates. The use of several transistors in place of a multiple-base transistor will lead to the same logical function results but have slower switching operation with a large number of circuit components or consume a larger space in the semiconductor material when implemented in monolithic integrated circuit form. However, for logic function purposes, the logic gate circuits shown in FIG. 5 can be substituted for those shown in FIG. 3 on a one-to-one correspondence basis.

Figure 6A:
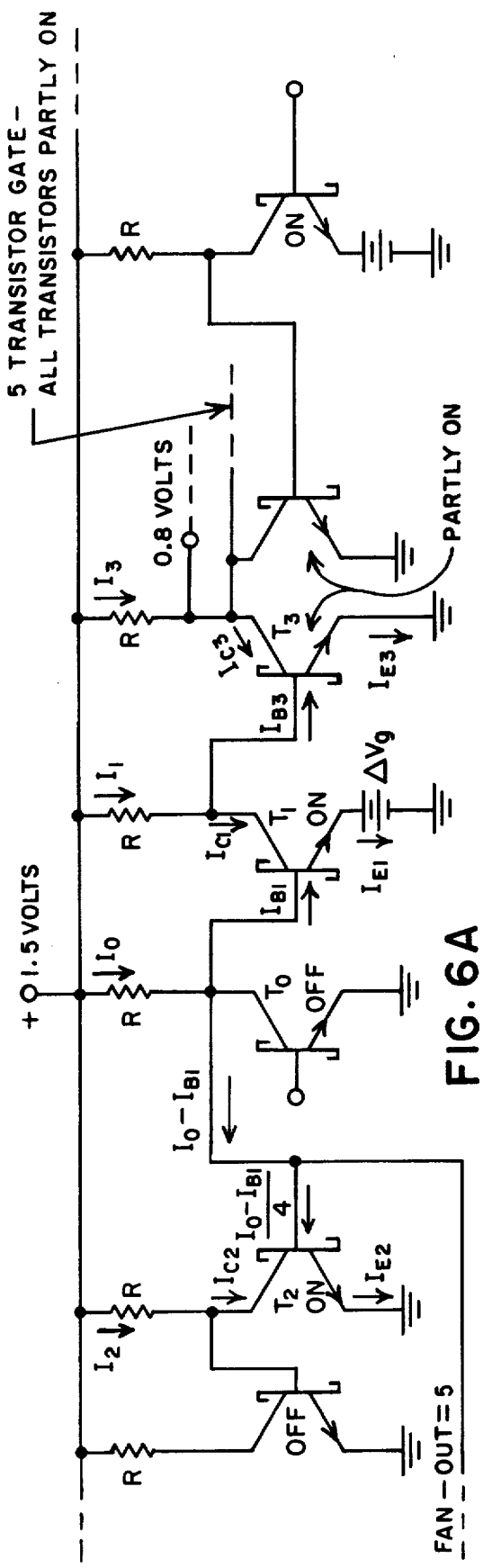
FIGS. 6A, B and C show logic gate systems used in analyses.
Figure 6B:
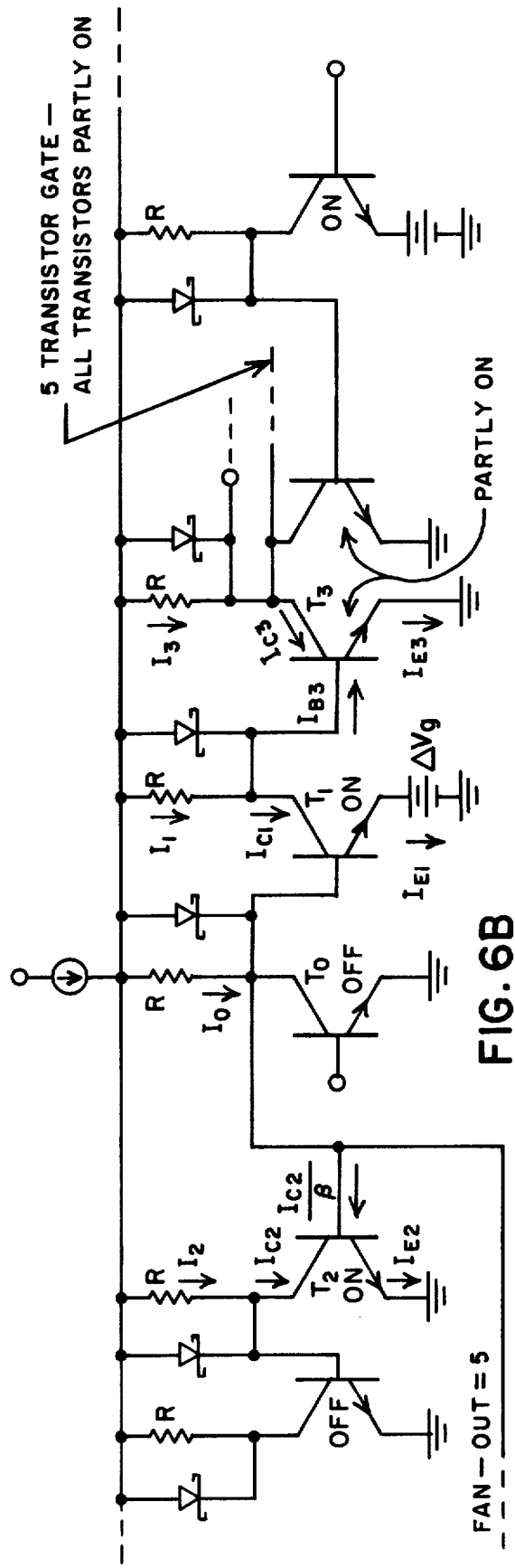

To see that logic circuits of the type shown in FIGS. 2B and 2C avoid the "current-hogging" problem without resorting to an emitter resistor such as shown in FIG. 1, a comparison will be provided with the old DCTL logic family in the situation where Schottky transistors are used with that logic family for switching rapidity. For ease of comparison, logic gates of the type shown in FIG. 5 will be used. As they perform the same logical function at the same voltage and current levels, no different result is obtained from use of these logic gates as opposed to those shown in FIG. 3. Thus, FIG. 6A shows a Schottky transistor DCTL logic circuit having a worst case layout for a typical operating situation to be used in determining the maximum allowable voltage differential in an emitter circuit of a transistor in a logic gate before an erroneous logic state occurs in a subsequent logic gate. FIG. 6B is a counterpart of FIG. 6A for the same general logic system but using logic gates of the type shown in FIG. 5.

As just indicated, the analysis proceeds on the basis of calculating the $\Delta V_g$ just required in the emitter circuit of transistor $T_1$ to cause the collector of transistor $T_3$, which should be an off transistor with its collector at the high logic state voltage level, to be at a low enough voltage to erroneously turn off the transistor in a succeeding logic gate. In FIG. 6A, the worst case requirement for turning off such a succeeding transistor is assumed to be that the collector voltage level of transistor $T_3$ need only drop to 0.8 volts.

Transistor $T_3$ is part of a five transistor gate in which all of the transistors are assumed to be partly on—this situation occurs in both FIGS. 6A and 6B—to thereby require that only the minimum current need to be drawn through partly on transistor $T_3$ to cause an error. In FIG. 6A, this is to be the minimum current to cause the collector of $T_3$ to drop to a voltage of 0.8 volts. This minimum collector current results in needing the smallest possible voltage drop across the base-emitter junction of transistor $T_3$ to which the collector of transistor $T_1$ must rise to cause the partial turning on of transistor $T_3$ in both FIGS. 6A and 6B. A fan-out of 5 is assumed to be the maximum fan-out in the circuit in both FIGS. 6A or 6B; in particular, there is assumed a fan-out of 5 logic gates from the collector of transistor $T_0$ in each figure so that the maximum amount of current is bled away from the base of transistor $T_1$ by virtue of this fan-out. Hence, the minimum emitter circuit voltage differential $\Delta V_g$ to cause a logic signal error will emerge from the analysis (which will be the maximum allowable voltage differential) to thereby provide a worst case analysis result for the "current-hogging" situation in both FIGS. 6A and 6B. In practice, the voltage differential $\Delta V_g$ can be the sum of the mismatch in threshold voltages between transistor $T_3$ and other transistors fanning out from the collector of transistor $T_0$ and of the differences in voltage drops across resistances in the ground interconnections involving these same transistors.

The DCTL circuit of FIG. 6A is to be operated with supply voltage of 1.5 volts, the lowest practicable voltage for operating such a circuit if the circuit is to tolerate the maximum base-emitter junction voltage drops occurring at very cold temperatures, to tolerate typical voltage source variations, and to tolerate resistance losses along the power supply leads (or metallization interconnection system power supply paths typically occurring in monolithic integrated circuits). The voltage drop across the logic gates of FIG. 6B, which is the voltage occurring at the output of the current source in FIG. 6B, is just a bit greater than the $V_{BE}$ drop of a transistor in that circuit as stated above in connection with FIG. 3. Thus, the circuit of FIG. 6B operates with a smaller voltage across its logic gates than does that of FIG. 6A. This is an important factor in explaining the result of the following calculations which shows a larger emitter circuit voltage differential $\Delta V_g$ can be tolerated in the circuit of FIG. 6B than can be tolerated in the circuit of FIG. 6A. All resistors in each of these circuits are assumed to have a resistance value equal to R.

Turning first to the calculation based on FIG. 6A, the assumed voltage for an error occurring at the collector of transistor $T_3$ leads to the following value for current $I_3$:

$$I_3 = (1.5 - 0.8)/R = 0.7/R.$$

This leads to a collector current $I_{C3}$ through transistor $T_3$, assuming each of the partly on transistors in the five transistor gate draw approximately the same current, which is the following:

$$I_{C3} = (0.7/R)/5 = 0.14/R.$$

Assuming that the other transistors in the fan-out from the collector of transistor $T_0$ are fully on with a base-emitter junction drop of 0.8 volts so that $V_{BE2} = 0.8$ V, the current $I_0$ is:

$$I_0 = (1.5 - 0.8)/R = 0.7/R.$$

The collector current for transistor $T_2$ can be found by noting that with transistor $T_2$ fully on, there will be a drop thereacross of 0.4 volts since it is a Schottky transistor. Assuming no base current is drawn by the succeeding transistor connected to the collector of $T_2$, the current $I_{C2}$ is:

$$I_{C2} = (1.5 - 0.4)/R = 1.1/R.$$

The base current of transistor $T_2$ can be seen in FIG. 6A to be $(I_0 - I_{B1})/4$. Because of "current-hogging", $I_{B1}$ can be taken to be approximately zero so that from equation for $I_0$ above, $$I_{B2} = I_0/4 = 0.7/4R.$$

Then the emitter current for transistor $T_2$ is, from the last two equations and the well-known current constraint for a bipolar transistor, the following:

$$I_{E2} = I_{B2} + I_{C2} = (0.7/4R) + (1.1/R) = 1.275/R.$$

Since the base current for transistor $T_3$ is quite small with $T_3$ being only partly on, this current may be assumed zero so that $I_{C3} = I_{E3}$. Then the voltage difference between the base-emitter junction of transistors $T_3$ and $T_2$ can be found through the well-known base-emitter junction formula which can be applied as follows with relatively closely matched junctions (such as occurs in monolithic integrated circuits):

$$\Delta V_{BE\,2,3} = \frac{kT}{q} \ln \frac{I_{E2}}{I_{E3}} = .026 \ln \frac{\frac{1.275}{R}}{\frac{0.14}{R}} = 0.057 .$$

This leads to a voltage drop across the junction of transistor $T_3$ equal to $$V_{BE3} = V_{BE2} - \Delta V_{BE\,2,3} = 0.8 - 0.057 \approx 0.74.$$

With this value for the junction voltage across transistor $T_3$ and noting again the above assumption that the base current into transistor $T_3$ is approximately zero so that $I_1 = I_{C1}$, the collector current for transistor $T_1$ is found to be $$I_{C1} = (1.5 - 0.74)/R = 0.76/R$$

With the base current into transistor $T_1$ approximately zero because of "current-hogging" as noted above, $I_{C1} = I_{E1}$. This leads to the following current ratio:

$$I_{E2}/I_{E1} = (1.275/R)/(0.76/R) = 1.68 .$$

Then, from the well-known base-emitter junction equation used again as above, the emitter circuit voltage differential $\Delta V_g$ can be calculated as follows:

$$\Delta V_g = (kT/q) \ln (I_{E2}/I_{E1}) = 0.026 \ln 1.68 = 0.013 = 13 \text{ mV} .$$

Hence, only 13 mV due to a ground resistance voltage drop or a base-emitter junction mismatch or both in total can be tolerated in the DCTL circuit of FIG. 6A before an erroneous logic state will occur in the worst case in ordinary circuit operation.

Turning now to the circuit of FIG. 6B, it is more convenient to use current ratios in analyzing this circuit. Thus, rather than noting a particular voltage on the collector of transistor $T_3$ required for an error as began the analysis for the circuit in FIG. 6A, the analysis for the circuit in FIG. 6B begins by noting a relationship between currents $I_1$ and $I_3$. First, in the worst case, current $I_1$ will be as small as possible so that the voltage in the collector of transistor $T_1$ is as high as possible to provide the greatest possibility for the turning on of transistor $T_3$. Second, since transistor $T_1$ is to be nearly in the fully on condition while transistor $T_3$ and the other four transistors in the gate along with transistor $T_3$ are in only in the partly on condition, current $I_1$ even in the worst case could be no less than equal to current $I_3$ or $I_1 = I_3$. Assuming, again, that the current split more or less equally between the partly on transistors in the five transistor gate, the following equation must hold:

$$I_{C3} = I_3/5 .$$

Again, since transistor $T_3$ is only partly on, the base current for transistor $T_3$, $I_{B3}$, will be quite small and can be taken as approxmately zero. In this case, with $I_{B3} = 0$ and $I_1 = I_{C1}$ as just shown, $$I_{C1} = I_1 = I_3 = 5\,I_{C3},$$

with the result $$I_{C1}/I_{C3} = 5 .$$

The Schottky diode connected to the collector of transistor $T_1$ will not be a factor in determining $I_{C1}$ as only the single transistor $T_1$ is drawing current through the collector circuit load resistor paralleling this Schottky diode. And further, the collector of transistor $T_1$ is at voltage high enough to partly turn on transistor $T_3$ also lowering the voltage drop across the collector load resistor. The resulting current $I_1$, for the normally chosen value of the collector load resistance, R, will not cause a voltage drop across the collector resistor exceeding the threshold voltage of the corresponding Schottky diode. The Schottky diode connected to the collector of transistor $T_3$ also will not be a factor in determining current $I_{C3}$ since all these transistors are only partly on thereby keeping current $I_3$ relatively small.

Concerning the other Schottky diodes which are involved with transistors having a role in the present calculation, the Schottky diode connected to the collector of transistor $T_0$ will not be significant in determining current $I_0$ as this current is also relatively small. This is because $I_0$ needs only be sufficient to supply base currents to transistors in the fan-out from the collector of transistor $T_0$. The Schottky diode connected to the collector of transistor $T_2$ will be a factor in circuit operation with transistor $T_2$ fully on. Given that (i) the approximate threshold voltage of the Schottky diode is 0.4 volts, and that (ii) the base current to the succeeding transistor connected to the collector of $T_2$ approximately is zero since this succeeding transistor is off, the following equation holds as an approximate upper limit on the voltage drop across the collector resistor of $T_2$ because of the Schottky diode:

$$I_2R = I_{C2}R = 0.4.$$

From FIG. 6B, the voltage at the output of the current source across transistor $T_0$ must equal the voltage from the output of the current source across transistor $T_1$. Using the well-known base-emitter junction equation, the just started condition means $$I_0R + \frac{kT}{q} \ln \frac{I_{C2}}{I_S} = I_1R + \frac{kT}{q} \ln \frac{I_{C3}}{I_S} .$$

$I_S$ is the saturation current of the base-emitter junctions of the transistors involved and is taken to be the same for each on the assumption that these transistors are relatively closely matched as they are in monolithic integrated circuits. The collector currents $I_{C2}$ and $I_{C3}$ have been assumed to be approximately equal to their corresponding emitter currents as the base currents for these transistors will be quite small given the low voltage occurring across the logic gate circuits of FIG. 6B.

To keep transistor $T_1$ as least turned on as possible for the worst case, the voltage drop across the resistor connected to the collector of transistor $T_0$ should be as great as possible. Since there are five paralleled base-emitter junctions in series with this resistor with one of them drawing little or no current due to "current-hogging", a reasonable conservative assumption is that the current $I_0$ is entirely due to five base-emitter junctions behaving approximately like the base-emitter junction for transistor $T_2$. This being so, the following equation holds:

$$I_0 = 5(I_{C2}/\beta),$$

where $\beta$ is the common-emitter configuration current gain of $T_2$. Again, as above $I_1 = I_{C1}$. Substituting these last two equations into the equation above which equates voltage drops across the logic gate circuits from the current source output to ground, the following is obtained after some rearrangement:

$$5\frac{I_{C2}}{\beta} R = I_{C1}R + \frac{kT}{q} \ln \frac{I_{C3}}{I_{C2}},$$

which may be rewritten for $\beta = 100$ after some algebraic substitutions as $$.05 \, I_{C2}R = \frac{I_{C1}}{I_{C2}} I_{C2}R + 0.026 \ln \frac{I_{C3}}{I_{C1}} \frac{I_{C1}}{I_{C2}}.$$

Now substituting in this last equation the current ratio $I_{C1}/I_{C3}$ found above and the constraint on $I_{C2}R$ set out above, the following transcendental equation results:

$$.05 \cdot .4 = 0.02 = \frac{I_{C1}}{I_{C2}} (0.4) + 0.026 \ln \frac{1}{5} \frac{I_{C1}}{I_{C2}}.$$

This transcendental equation may be solved for the ratio of $I_{C2}/I_{C1}$ giving $I_{C2}/I_{C1} = 4.1$.

Once more using the base-emitter junction equation, the emitter circuit voltage differential $\Delta V_g$ between transistors $T_1$ and $T_2$ can be written:

$$\Delta V_g = \frac{kT}{q} \ln \frac{I_{E2}}{I_{E1}}.$$

Assuming in the manner above that currents $I_{C1}$ and $I_{C2}$ approximately equal to the corresponding emitter currents, the following result is obtained from the last two equations:

$$\Delta V_g = \frac{kT}{q} \ln \frac{I_{C2}}{I_{C1}} \; 0.026 \ln 4.1 = 0.037 = 37 \, mV,$$

which is almost three times the result obtained for $\Delta V_g$ in the DCTL circuit case of FIG. 6A.

The substantial improvement in the toleration of ground resistance voltage drops or junction mismatches in the circuit of FIG. 6B over the DCTL circuit of FIG. 6A is due primarily to the difference in the manner in which power is supplied to these two circuits. The use of a current source leading to a substantially lower voltage drop across the logic gates of the circuit in FIG. 6B is a significant factor in this toleration difference. Because the voltage value at the output of the current source is just slightly greater than the base-emitter junction threshold voltage, very little voltage occurs across the load resistor for transistor $T_1$ due to $I_1$. Thus, the occurrence of $\Delta V_g$, tending to turn off transistor $T_1$, can cause a much greater change in the ratio of the currents $I_{C1}$ and $I_{C2}$ in the circuit of FIG. 6B than can be tolerated in the circuit of FIG. 6A. In this latter circuit, the current through the load resistor connected to the collector of transistor $T_1$ is sufficient to cause a substantial voltage drop across this resistor in normal operation so that a substantial change in the ratio between the currents $I_{C1}$ and $I_{C2}$ in this circuit will have a much more immediate effect on transistor $T_3$. The typical metallization processes and the typical metallization interconnection leads made by these processes, and finally, the typical transistor base-emitter junction voltage mismatches all found in monolithic integrated circuits make the value for $\Delta V_g$ of 37 mV found for the circuit of FIG. 6B quite practical insofar as fabricating such a circuit in monolithic integrated circuit form. However, the value of only 13 mV found for $\Delta V_g$ for the circuit of FIG. 6A makes implementing a circuit of such logic gates in a monolithic integrated circuit impractically difficult.

Because of the small voltage drops occurring across the resistors marked R in the circuit of FIG. 6B and for other circuits using the logic gates of FIG. 2, and because of the nonlinear circuit components used in these logic gate circuits, there is a substantial question of what resistance value should be chosen for the load resistors in these logic gates. This is because the resistance value of these load resistors must exceed a certain minimum value if there are to be sufficient voltage drops thereacross to insure the propagation of logic signals along the logic levels in a cascade of these logic gates. However, larger values of resistance necessarily means that larger spaces for the resistors must be taken in the semiconductor material for a monolithic integrated circuit version of logic circuits of FIG. 2. Further, larger resistance values also lead to slower circuit switching operation because of the longer time constants introduced by the use of such larger resistors in connection with the stray and parasitic capacitances occurring in a monolithic integrated circuit, capacitances which must be charged during switching operation of the circuit. Thus, the proper choice of a resistance value for the load resistors is an important problem to be solved in the design of a logic gate system using the logic gate circuits of FIG. 2.

An example of the solution for a three logic level logic system for the resistance value for logic gate circuit load resistance values in the worst case can be made with the aid of the circuit of FIG. 6C. In the circuit of FIG. 6C, a fan-in and a fan-out of greater than one are provided in the locations in which the circuit performance will be most seriously degraded by such a fan-in and fan-out situation. The fan-in situation involving the several bases of transistor $T_2$ presents a worst case of many base currents being sufficient so collector current is drawn through the corresponding bases of transistor $T_2$ such that $T_2$ is just at the off condition. The resulting collector current brings the collector of transistor $T_2$ to a lower voltage value. Similarly, the fan-out situation at the collector of transistor $T_2$ tends to increase the maximum current through the load resistor at the collector of transistor $T_2$ to again decrease the collector voltage of transistor $T_2$.

The battery in the collector circuit of transistor $T_2$ represented by the symbol $\Delta V_c$ represents having a voltage drop in the power supply leads at the worst possible place in a circuit of FIG. 6C, that is, acting to lower the voltage at the collector of transistor $T_2$. The battery having the symbol $\Delta V_g$ in the emitter circuit of transistor $T_3$ represents having a voltage drop appear across a ground circuit resistance or a base-emitter junction threshold voltage mismatch of both occurring in the worst possible place, i.e. acting to turn transistor $T_3$ off despite that transistor $T_3$ is intended to be in the on condition. Finally, the common-emitter configuration current gains for the transistors in FIG. 6C are to be of the lowest possible value, and the temperatures at which these transistors are operating is assumed to be at the highest possible value leading to the maximum voltage swing required as can be seen from the voltage swing equation derived in the following analysis. The problem presented is then to define the value of the resistance R for the collector load resistors in the logic gates represented by transistors $T_1$ through $T_4$ to insure that the current $I_{C3}$ is sufficient to operate further logic gates fanning out from the collector of transistor $T_3$.

A first equation concerning the circuit of FIG. 6C can be written by noting that the voltage across the collector circuit for transistor $T_1$ plus the voltage across the pertinent base-emitter junction of transistor $T_2$ must equal the voltage across the collector circuit of transistor $T_2$ and the pertinent base-emitter junction and emitter circuit of transistor $T_3$. This results in the following equation:

$$I_{C1}R + \frac{kT}{q} \ln \frac{\frac{I_{E2-tot}}{n_i}}{\frac{I_{ES-tot}}{n_i}} =$$
$$\Delta V_c + I_{C2-tot}R + n_o \frac{I_{C4}}{\beta} R + \frac{kT}{q} \ln \frac{I_{E3}}{I_{ES}} + \Delta V_g.$$

In the above equation, the pertinent base current for the off transistor $T_2$ has been approximated as being zero insofar as its effect in the collector circuit of $T_1$ and the base current for transistor $T_3$ has been approximated to be that of the other fan-out transistors for purposes of a worst case analysis. The Schottky diode in the collector load circuit of transistor $T_1$ has no significant role in the above equation as current $I_{C1}$ and the base current drawn by transistor $T_2$ do not together cause a sufficient voltage drop in the $T_1$ collector load resistor to exceed the threshold voltage of this Schottky diode. For similar reasons, the Schottky diode in the collector load circuit for the transistor $T_2$ also has no significant effect and no need not be reflected in the above equation.

The foregoing equation can be written in a more convenient form by noting the following relationships based on well-known current constraints for a bipolar transistor, $$I_{E2-tot} = n_i I_B + I_{C2-tot} =$$
$$\frac{I_{C2-tot}}{\beta} + I_{C2-tot} = I_{C2-tot}(\frac{\beta + 1}{\beta}),$$
$$I_{E3} = I_{B3} + I_{C3} = \frac{I_{C3}}{\beta} + I_{C3} = I_{C3}(\frac{\beta + 1}{\beta}).$$

Similarly, $I_{E4} = I_{C4} (\beta + 1/\beta)$. The base-emitter junctions in multiple-base transistor $T_2$ are assumed to be relatively closely matched so that the individual currents through these bases are equal, that is, each collector current and base current into each base region and each emitter current out of each emitter region are, correspondingly for each kind, equal to one another, including the reverse saturation currents associated with each base-emitter junction. Hence, the reverse saturation current $I_{ES}$ for each base-emitter junction can be written $I_{ES} = I_{Es-tot}/n_i$.

Then, the first equation in this analysis can be rewritten as follows:

$$\frac{kT}{q} \ln \frac{\frac{I_{C2-tot}}{n_i}}{I_{ES}} (\frac{\beta + 1}{\beta}) + I_{C1}R =$$
$$\Delta V_c + \frac{I_{C1}RI_{C2-tot}}{I_{C1}} + n_o \frac{I_{C4}}{\beta} R +$$
$$\frac{kT}{q} \ln \frac{I_{C3}}{I_{ES}} (\frac{\beta + 1}{\beta}) + \Delta V_g.$$

The criteria to ensure that the logic signal will propogate is to require that the collector current in transistor $T_3$ equals the collector current in transistor $T_1$, i.e. that there is no diminution in the collector currents of succeeding on transistors along the cascade of logic gates, or $I_{C3} = I_{C1}$. Introducing this criterion into the last equation results, after some rearrangement, in the following equation:

$$I_{C1}R - I_{C1}R \frac{I_{C2-tot}}{I_{C1}} - \frac{n_o}{\beta} I_{C4}R =$$
$$\frac{kT}{q} \ln \frac{I_{C1}}{\frac{I_{C2-tot}}{n_i}} + \Delta V_c + \Delta V_g.$$

Another condition to be met by the circuit of FIG. 6C is that the voltage drop across the base-emitter circuits in each of the fan-out transistors be equal. This condition can be expressed as $$\frac{kT}{q} \ln \frac{I_{E4}}{I_{ES}} = \frac{kT}{q} \ln \frac{I_{E3}}{I_{ES}} + \Delta V_g.$$

Again, this equation can be rewritten to eliminate the emitter current variables, by substituting from the above equations the collector current variables, $$\frac{kT}{q} \ln \frac{I_{C4}}{I_{ES}} (\frac{\beta + 1}{\beta}) = \frac{kT}{q} \ln \frac{I_{C3}}{I_{ES}} (\frac{\beta + 1}{\beta}) + \Delta V_g.$$

Finally, the criterion for no degradation in the logic state signal, $I_{C3} = I_{C1}$ can be introduced yielding, after some rearrangement, the following:

$$I_{C4} = I_{C1} \exp(q\Delta V_g/kT).$$

This last equation can be substituted into the finally rewritten version of the equation above embodying the first condition on the circuit of FIG. 6C to provide the following expression:

$$I_{C1}R = \frac{\frac{kT}{q} \ln (\frac{I_{C1}}{\frac{I_{C2-tot}}{n_i}}) + \Delta V_c + \Delta V_g}{1 - \frac{I_{C2-tot}}{I_{C1}} - \frac{n_o}{\beta} \exp \frac{q\Delta V_g}{kT}}.$$

A reasonable requirement to impose on the performance of logic gate circuits of FIG. 6C is that the ratio of the smallest on condition transistor collector current to the largest off condition transistor collector current should be at least 10. Thus, $I_{C1}/I_{C2-tot} = 10$. A practical worst case value for a monolithic integrated circuit for the largest voltage drop across ground interconnection resistances and the largest mismatch in threshold voltage across base-emitter junctions might be 18 mV, that is, $\Delta V_g = 0.018$. A voltage drop of practical value across resistances in the power supply leads would be 10 mV, i.e. $\Delta V_c = 0.020$. For a maximum junction temperature of 160° C. one obtains $kT/q = 0.038$ or 38 mV. Then, for a choice of fan-in and fan-out levels ($n_i$ and $n_o$) the above equation can be solved for $I_{C1}R$. This may be substituted into the final rewritten version of the equation expressing the second condition above, $$I_{C4}R = I_{C1}R \exp(q\Delta V_g/kT),$$

to provide approximately the minimum voltage change required across load resistors in the collector circuits of the transistors of FIG. 6C.

Then, for a choice of (i) the value of the current to be supplied on the average to a logic gate, or (ii) a choice of the current to be supplied by the current source and a determination of the number of logic gates present, the value R can be calculated from the last equation. A typical value for fan-in and fan-out levels of 5 each might be 300Ω.

To prevent the logic gates in a logic system using the logic gate circuits of FIG. 2 from switching too slowly—in view of the desired switching rapidity—because of the need for large value collector resistors, as might be found from the foregoing worst case analysis, several measures might be considered. The first possibility is to consider the small likelihood of some worst case conditions assumed in the analysis and to moderate them to more accurately reflect the conditions in actual use. Also, some of the worst case conditions can be moderated by design measures for a monolithic integrated circuit such as providing sufficiently large cross-sections in the interconnection circuits to reduce any resistive drops occurring therein to be below the values chosen in the above worst case analysis. Also, the fan-in and fan-out levels arbitrarily chosen in the above analysis may be restricted to smaller numbers to reduce the collector load resistance value obtained by the above analysis. Finally, inverters of the circuit forms shown in FIGS. 2 may be added at some points in the logic system, or other similar measures taken, where it is necessary to have larger fan-in or fan-out levels at the cost of some space and power dissipation in a monolithic integrated circuit.

As pointed out in connection with FIG. 2A, the current source most likely to be used with a logic gate system using the logic gates of FIG. 2 is a voltage source and resistor in series therewith. To use such a voltage source and to determine the value of the current source resistor, it typically is estimated that one-half the logic gates provided in a logic system will be on and one-half of them will be off. Then, after deciding on an acceptable current for individual logic gate operation, the total current to be drawn by the logic system is determined and from that the value of the voltage source, the current source resistor, can be determined.

Of course, where the current source resistor is to be a resistor external to the logic system such as might occur if the logic system is formed in a monolithic integrated circuit chip, trial and error can be used to set the most satisfactory resistance value for the current source and its series resistor. Often, only the series resistor can be selected as the voltages available for the logic system will be fixed quite typically at five volts. For monolithic integrated circuits having a relatively small number of logic gates therein, it may very well be desirable to also integrate the current source resistor as power dissipation in such a resistor need not be very great.

The availability of a voltage source having a five volt capability for use in the current source, as just discussed, is also particularly convenient for providing compatibility between the logic gates of FIG. 2 and other logic families such as TTL logic gates and for providing output logic circuits capable of substantially more power for driving loads that are not on the monolithic integrated circuit chip. Thus, a TTL logic circuit operated from five volts can be introduced directly on the monolithic integrated circuit chip otherwise containing primarily gates of the type shown in FIG. 2. FIG. 2 logic gates could drive the TTL gate through an intermediate grounded emitter, open collector transistor. Further, RTL logic circuits could be provided on the chip as output gates to be used as drivers for input logic gates formed in other monolithic integrated circuit chips, etc. Generally, many of the same possibilities are available for the logic gates of FIG. 2 as are available for the logic gates shown in FIG. 1 concerning compatibility with other logic families and concerning input and output logic gates in monolithic integrated circuit chips. These possibilities are discussed for the logic gates shown in FIG. 1 in U.S. Pat. No. 3,970,866 made reference to above. In that patent, it is also indicated for instance that the NOR gates of the logic family of FIG. 1 are compatible with the ECL logic gate family if the low voltage supply is operated at a minus (−) 2 volts rather than at a ground voltage. The same possibility exists for use of the logic gates of FIG. 2.

Turning now to monolithic integrated circuit layouts for the logic gates of FIG. 2, FIG. 7 shows a monolithic integrated circuit form of the logic gate shown in FIG. 2B. An isolating region, 70, is shown surrounding an isolated region, 71. Isolating region 70 is of a p-type conductivity and is formed by diffusion into an n-type conductivity silicon epitaxial layer provided on a silicon wafer to form the n-type conductivity isolated region 71. Further p-type conductivity regions, 72, are formed, typically by diffusion methods but alternatively by ion implantation methods, to serve as bases for the transistor to be formed in region 71. Further regions, 73, are formed in the bases 72 as emitter regions of n+-type conductivity. Formed simultaneously with emitter regions 73 are contact regions, 74, which also, of course, are of n+-type conductivity.

There is an electrically insulating and passivating layer provided over the silicon epitaxial layer, typically of silicon dioxide, although other materials can be used for this layer such as silicon nitride or, alternatively, multiple layers of these different materials may be used for insulating and passivating purposes. In any event, cuts are made through the protective layer or layers formed over the epitaxial layer to accommodate electrical interconnection leads to electrically interconnect the various aforesaid regions with one another and with other regions in the monolithic circuit to form functioning circuits. These cuts are shown here to accept a metallization deposition or possibly to accept a doped polysilicon deposition to form these interconnections. Other interconnection means are known in the art, including diffused regions, which could also be used for such interconnections.

Possible interconnection runs or leads are shown by dashed lines and are discussed in the following.

Cuts designated 75 are provided to expose emitter regions 73 to allow emitter contacts to be made to thereby permit internally shorting the emitters 73 to one another by virtue of an interconnection lead, 76, and for connection to a low voltage value voltage source. Cuts designated 77 are made to expose base regions 72 to receive input signals. These input signals are transmitted via the interconnection leads designated 78.

To provide the Schottky diode, a cut, 79, is made exposing the unmodified epitaxial material. Cuts designated 80 and 81 expose the epitaxial material modified by the provision of the n+-type conductivity contact regions 74. A metallization interconnection lead, 82, makes an ohmic contact to the modified epitaxial layer at a region 74 through cut 81 and a Schottky contact to the unmodified epitaxial layer through the cut labelled 79. Another interconnection lead, 83, provides the output signal path by making electrical contact to the transistor collector provided in region 71 by an ohmic contact to the modified epitaxial layer at a region 74 through cut 80. Lead 82 also permits connection to the current source supplying power to the logic gate formed in isolated region 71.

The portion of region 71 between contact cuts 79 and 81 forms the collector load resistor for the gate of FIG. 2B and is marked 84. This resistor is provided by the unmodified epitaxial material in isolated region 71. To increase the value of the resistance of the epitaxial region between cut 79 and 81, the buried layer provided below and into the epitaxial layer, while extending below all of the bases 72, the collector cut 80 and the Schottky cut 79, does not extend beneath the load resistor portion 84 of isolated region 71.

An alternative layout is shown in FIG. 8 where only a two-input gate is depicted. Again, there is a p-type conductivity isolating region, 800, provided by diffusion into the n-type conductivity silicon epitaxial layer to provide an n-type conductivity isolated region, 801. The p-type conductivity regions designated by the numerals 802 serve as bases for the transistor to be provided in isolated region 801 while a further p-type conductivity region, 803, simultaneously provided with regions 802 is to serve as the load resistor for the logic gate. Further, regions, 804, are n+-type conductivity regions serving as emitters. Simultaneously provided with emitter regions 804 is a collector contact region, 805 also of n+-type conductivity.

Again, cuts are made in a protective and passivating layer provided over the silicon epitaxial layer to facilitate electrical interconnections. Cuts designated 806 expose the bases for input signal leads, 807. The cuts designated 808 expose the emitters for internal shorting together and for connection to a low voltage value voltage source by an interconnection lead, 809. The cut marked 810 exposes collector contact region 805 and one end of resistor 803 to provide the output signal path for the logic gate contained within isolated region 801. This output signal is provided on an interconnection lead, 811, which makes ohmic contact to both region 805 and region 803 through cut 810. A cut, 812, exposes the unmodified epitaxial layer in part and exposes the other end of resistor 803 for a metallization interconnection, 813. The part of cut 812 which is not involved in exposing resistor 803 will permit a Schottky contact to be made by lead 813 to provide the Schottky diode for the logic gate. The portion of interconnection 813 in ohmic contact with resistor 803 as the result of the exposure by cut 812 connects resistor 803 to the anode of the Schottky diode formed by lead 813 contacting the unmodified epitaxial material of region 801 where exposed by cut 812. Lead 813 also permits connection to the current source supplying power to the logic gate formed in region 801.

FIG. 9 again represents a two-input logic gate which is the same as that in FIG. 8, except for the use of a single emitter rather forming a separate emitter for each base. Thus, FIG. 9 corresponds to the logic gate shown in FIG. 2C, except for the use of two inputs rather than three. The numerical designations in FIG. 9 are those also of FIG. 8.

Figure 10A:
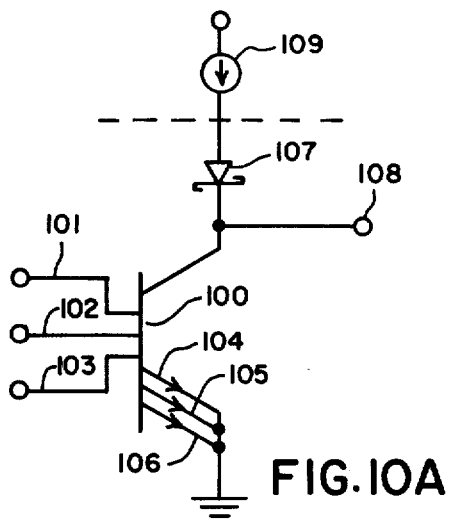
Figure 10B:
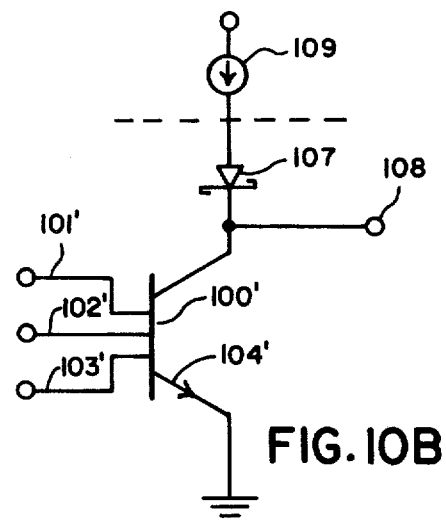

The logic gate circuit of FIG. 2, as pointed out above, may not switch sufficiently rapidly for the load resistor resistance values required to accommodate the desired fan-in and fan-out levels especially in the worst case. Further, these load resistors consume a substantial amount of semiconductor material space in a monolithic integrated circuit version of the logic gates shown in FIG. 2. FIGS. 10A and 10B show alternative logic gate circuits in which the diode-paralleling collector load resistors have been entirely removed. While the removal of these collector load resistors can solve the just mentioned difficulties that the use of these resistors cause, certain trade-offs are evident. The circuits of FIGS. 10A and 10B operate with a higher voltage from the output of the current source across the logic gates as currents must always flow through the Schottky diodes which are now the sole collector loads for the transistors. Also, the Schottky diodes must be well matched from one to another if collector currents of similar magnitudes are to flow in these logic gate transistors in the on condition in the logic system. Dissimilar collector currents means that some logic gates will switch more slowly than others, an unsatisfactory situation in most instances.

Again, transistor 100 in FIG. 10A is a multiple-base and multiple-emitter bipolar transistor wherein an emitter is formed in each of the several separate bases provided commonly in a collector region of the transistor with the emitters being internally shorted. Transistor 100 is again shown with three base leads from the three bases needed for the arbitrarily picked three-input logic gate, base leads 101, 102 and 103. There are three emitter leads from the corresponding three emitters, emitter leads 104, 105 and 106. As indicated, base leads 101, 102 and 103 serve as inputs to receive logic signals from sources of such signals which, again, could be another logic gate preceding the gate shown in FIG. 10A. The internally shorted emitter leads 104, 105 and 106 are connected to a low voltage value voltage source again shown here as ground. This need not be ground, however, as pointed out above in connection with the discussion concerning the compatibility between logic gates shown in FIGS. 2 and the ECL logic family.

The collector load for transistor 100 is a Schottky diode, 107, which is connected between the collector of transistor 100 and a current source, 109, supplying power to the logic gate of FIG. 10A. A horizontal dashed line is shown separating the logic gate and current source 109. The collector of transistor 100 also serves as the logic gate output, 108. Again, current source 109 often will be a voltage source with a resistor in series therewith although a transistor circuit current source could, of course, be used here or in the gates of FIG. 2.

As stated, the collector load in the circuit of FIG. 10A is Schottky diode 107. However, present fabrication techniques using aluminum often do not yield Schottky diodes for collector loads which are sufficiently well matched from logic gate to logic gate where these logic gates use the logic gate circuit of FIG. 10A. Thus, Schottky diode 107 will often be made with some additional metallization process steps prior to providing aluminium or another material to form the interconnection network portion making an electrical connection to the Schottky diode anode. Desirably, these additional process steps will form a Schottky diode having a low threshold voltage, low stray capacitance and relatively low effective series resistance. A metallization fabrication process which will form a suitable Schottky diode provides a metal-metal silicide anode for the diode, typically palladium silicide. Further metallization process steps may be required to form an anode structure allowing satisfactory interconnection between the Schottky diode anode and the material of the interconnection network which would be typically aluminum. Such palladium silicide Schottky diodes enjoy relatively close matching from diode to diode when these are formed simultaneously on the same silicon epitaxial layer provided upon a silicon semiconductor material wafer in a monolithic integrated circuit. This is particularly true for the diode characteristic of such Schottky diodes.

However, there is also an effective series resistance provided in any Schottky diode which can be set in resistance value to some extent by controlling the area of the epitaxial layer used in forming the Schottky diode. This effective series resistance can also be made relatively uniform from diode to diode where a metal silicide anode is used. Such inherent Schottky diode resistance can be important in the operation of FIG. 10A in absence of other measures being taken to ensure logic signal propagation along multiple logic levels provided by cascaded logic gates. Further discussion on this point occurs below.

FIG. 10B again shows the circuit of the logic gate in FIG. 10A, but instead using a multiple-base bipolar transistor, 100′, and a single emitter. This transistor has multiple bases therein formed in a collector region common to them all and a single emitter region also common to the multiple bases. The leads from the multiple bases of transistor 100′, leads 101′, 102′ and 103′, are to receive logic signals from sources of such signals such as a preceding logic gate. The single emitter lead from the emitter transistor 100′ is designated 104′ is again shown connected to ground. The collector load, Schottky diode 107, and the current source 109 each has the same function it had in FIG. 10A. Again, the interaction which occurs between the bases of transistor 100′ must be strictly controlled if the logic gate circuit of FIG. 10B of the transistor is to perform effectively as a multiple-base transistor.

Figure 11:
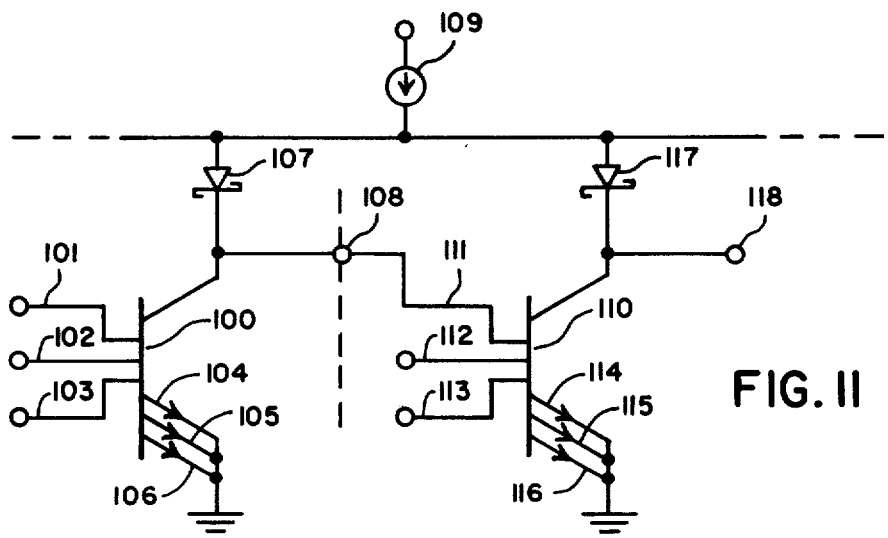
FIG. 11 shows a combination of FIG. 10A circuits.

A cascade of two logic gate circuits of the type shown in FIG. 10A to form two logic levels is shown in FIG. 11. The two cascaded logic gate circuits are separated by a vertical dashed line to form a logic gate on either side. The left-hand logic gate circuit again uses the designations used in FIG. 10A—which circuit was arbitrarily chosen as opposed to the circuit in FIG. 10B—with new designations being used in the right-hand logic circuit of FIG. 11. The right-hand logic gate circuit uses a multiple-base and multiple-emitter transistor 110 having base leads 111, 112 and 113 and having internally shorted emitter leads 114, 115, and 116 shown jointly connected to ground. Input lead 111 is connected to output 108 of the left-hand logic gate circuit of FIG. 11. A Schottky diode, 117, serves as the collector load of transistor 110 with its cathode connected to the collector of that transistor, the collector serving as the logic gate output, 118.

Assuming transistor 100 to be in the off condition, i.e. that the left-hand logic gate circuit has output 108 in the high logic state, it is clear that transistor 110 will be in the on condition so that the right-hand logic gate circuit has output 118 in a low logic state. Again, and obviously, if the left-hand logic gate circuit has transistor 100 in the on condition, the transistor 110 will be in the off condition so that the right-hand logic gate circuit will have output 118 in the high logic state while the left-hand logic gate circuit will have its output 108 in the low logic state. As with FIG. 3 in this situation of complementary results, most practical logic systems using the logic gate circuits of FIGS. 10A or 10B will have some of these logic gates, perhaps around half of them present, in the high logic state and some logic gates in the low logic state. In this situation, FIG. 11 shows that the voltage at the output of current source 109 will be approximately equal to the voltage drop across the collector load Schottky transistor, $V_s$, of the whichever of transistors 100 or 110 is in the off condition plus the voltage drop across the pertinent base-emitter junction, $V_{BE}$, of whichever of the transistors 100 or 110 is in the on condition.

As a more detailed example showing this result, assume transistor 100 to be in the off condition and hence that transistor 110 is in the on condition. The voltage drop from the output of current source 109 to ground consists of the voltage drop across Schottky diode 107 plus the voltage drop across the base-emitter junction of transistor 110 for the base-emitter junction associated with base lead 111. No matter what the fan-out is from output 108, the drop across Schottky diode 107 will not change very much. This is because Schottky diode 107 will already be operating beyond the threshold voltage in its volt-ampere characteristic and this diode will have a relatively small effective series resistance. Further, only relatively small base currents need be supplied through Schottky diode 107. Therefore, the voltage drop across transistor 110 will adjust so that this voltage drop plus the voltage drop across Schottky diode 117 just equals the voltage drop across Schottky diode 107 and the voltage drop across the pertinent base-emitter junction of transistor 110. Hence, transistor 110, although in the on condition, is kept out of saturation since its collector voltage cannot drop much more than the threshold voltage of diode 117 below the voltage at the output of current source 109. The current supplied through Schottky diode 117 to provide the collector current for transistor 110 in response to the base current occurring in base lead 111 will not significantly increase the voltage drop across Schottky diode 117 beyond its threshold voltage and the effect of the relatively small diode series resistance will not increase this voltage drop very much.

The logic gate operating voltage, consisting of a base-emitter junction voltage drop plus the voltage drop across a Schottky diode as pointed out above, it still a relatively low logic gate operating voltage although somewhat higher than that found in the circuit of FIG. 3. This low operating voltage and the keeping of logic gate transistors out of saturation agin means rapid switching operation because stray capacitance in the circuit need only be charged to this low operating voltage. Further, there is relatively small power dissipation in the logic gate because of this low operating voltage although again it is somewhat higher than that in FIG. 3. Also again, the rapidity of switching operation is benefitted by the use of a multiple-base transistor because no further isolated regions beyond that in which the transistor is formed for the logic gate are required. This, of course, reduces the space required in the silicon semiconductor material to form the logic gate circuit to thereby improve the density of logic gate circuits in a monolithic integrated circuit chip. In addition to the foregoing advantages, the elimination in the circuits shown in FIGS. 10 of the collector load resistor of the circuits shown in FIGS. 2 both tends to increase the rapidity of switching operation while at the same time reducing the space taken in the silicon semiconductor material for providing such resistors in a monolithic integrated circuit chip.

Figure 12:
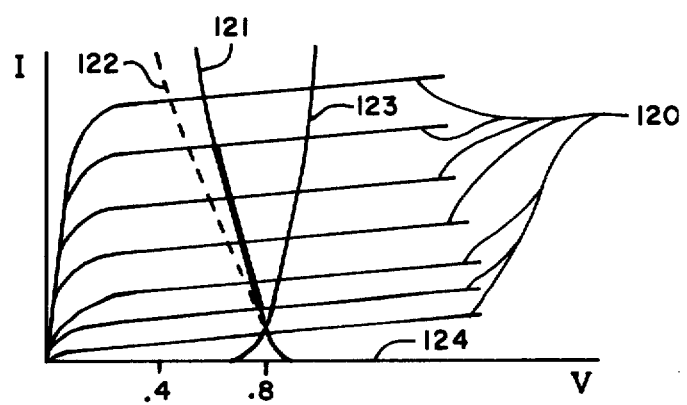
FIG. 12 shows a graph of the operation of a portion of the FIG. 11 circuit.

Turning now to FIG. 12, there is displayed in a graph having a current axis, I, and a voltage axis, V, the circuit component characteristics which are significant in the circuit operation of FIG. 11 as viewed at output 108. The characteristic curves having the designation 120 represent the common-emitter collector static characteristics for transistor 100. Curve 121 represents the forward volt-ampere characteristic of the collector load Schottky diode 107. The dashed line curve, 122, respresents the forward volt-amphere characteristic of a Schottky diode 107 having an additional resistance added in series therewith. Again, the knee in curves 121 and 122 occurs approximately at the resulting logic gate operating voltage less the threshold voltage of the Schottky diode 107, that is approximately at 0.8 volts. Curve 123 represents the forward volt-ampere characteristic of the base-emitter junction of transistor 110 which is associated with base lead 111. Point 124 along the axis designated by V in FIG. 12 represents approximately the resulting operating voltage which occurs across current source 109 in FIG. 12, and this will be approximately 1.15 volts. Voltage at output 108 in FIG. 11 will approximately follow the path of the heavily darkened portion shown in FIG. 12 during operation of the circuit of FIGS. 11 assuming there is no further resistance added in series with Schottky diode 107. Otherwise, the operation follows approximately the corresponding portion of curve 122 which, as can be seen from FIG. 12, would result in a larger voltage swing at output 108.

Figure 13:
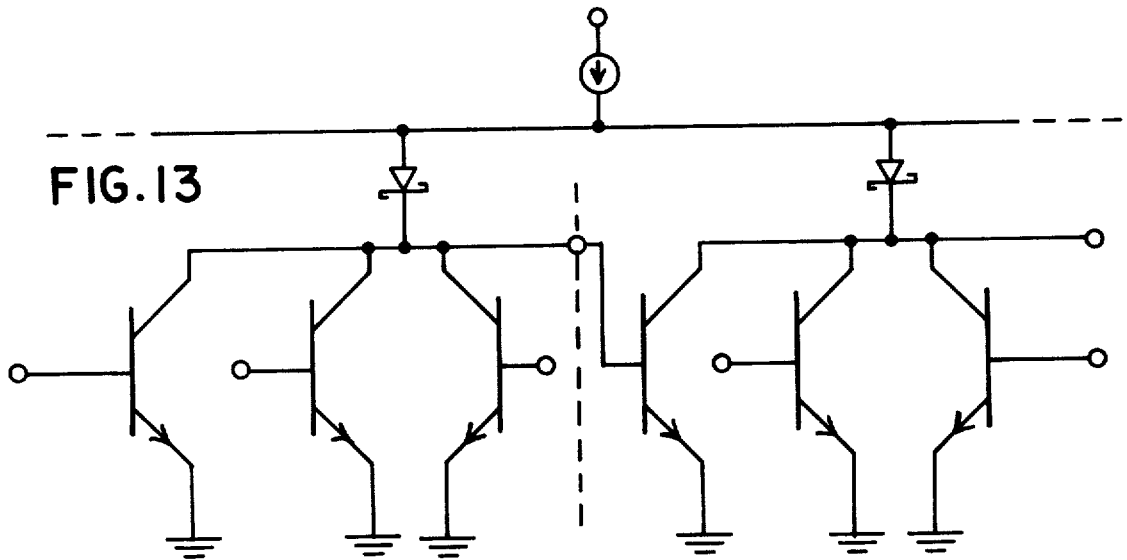
FIG. 13 shows a discrete device version of the FIG. 11 circuit, FIGS. 14A and B show another circuit embodiment of the present invention.

Again, multiple-base transistors are not the only transistors which could be used with the circuit of FIG. 11. If the disadvantages of reduced switching rapidity and, in a monolithic integrated circuit, the use of a larger number of components taking a larger space can be tolerated, the use of several transistors in place of a multiple-base transistor is possible. FIG. 13 shows the use of several transistors in place of the multiple-base transistors of FIG. 11 but retaining the same logic functions in the logic gates appearing on either side of the vertical dashed line in FIG. 13. That is for performing logic functions the logic gates circuits shown on either side of the dashed vertical line in FIG. 13 can be substituted for those similarly positioned in FIG. 11 on a one-to-one correspondence basis.

Figure 14A:
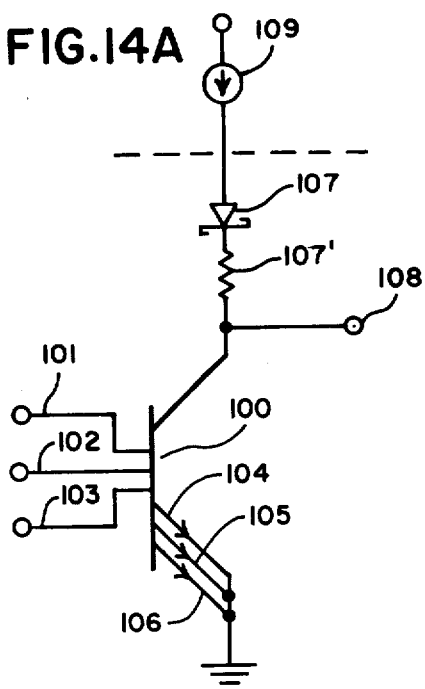
Figure 14B:
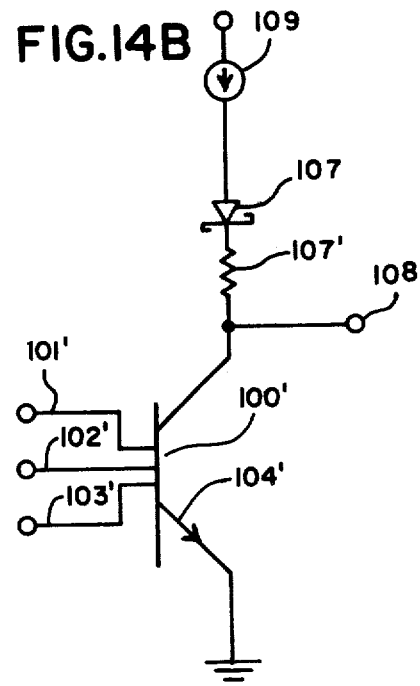

As noted above, the effective series resistance in a Schottky diode collector load will be important for ensuring the propagation of logic signals along the logic levels in the cascade of logic gates where no other provision is made to ensure such signal propagation. The propagation problem again occurs because the swing across the load, here the Schottky diode in the collector load circuit of the logic circuit gates of FIGS. 10A and 10B, is not sufficient given the nonlinear characteristics of the circuit components connected to output 108 in FIG. 11. FIGS. 14A and 14B show the logic gate circuits of FIGS. 10A and 10B with resistors added in series with the Schottky diode loads in the collector circuits therein. These resistors have been designated 107' to emphasize that they may well be part of the effective series resistance inherent in the construction of a Schottky diode.

The resistance values of such inherent resistors can be controlled by controlling the area of the junction in the Schottky diode between the anode, here likely a metal silicide as stated above, and the silicon epitaxial layer material portion serving as the diode cathode. For one fabrication process, the effective series resistance in such a Schottky diode can be easily adjusted between 5Ω and 500Ω by adjusting the diode area to being between approximately 6.0 mil$^2$ and 0.06 mil$^2$.

The foregoing values can be sufficient to ensure propagation in many applications of the logic gate circuits of FIGS. 14. Should conditions be present where somewhat more series load resistance is required, this is easily provided in a monolithic integrated circuit chip within a single isolation region by making use of the silicon epitaxial layer within the isolated region to add some resistance between the transistor collector and the Schottky diode collector load. The following worst case analysis indicates a method for determining the value of series collector resistance required to ensure logic signal propagation.

Figure 15:
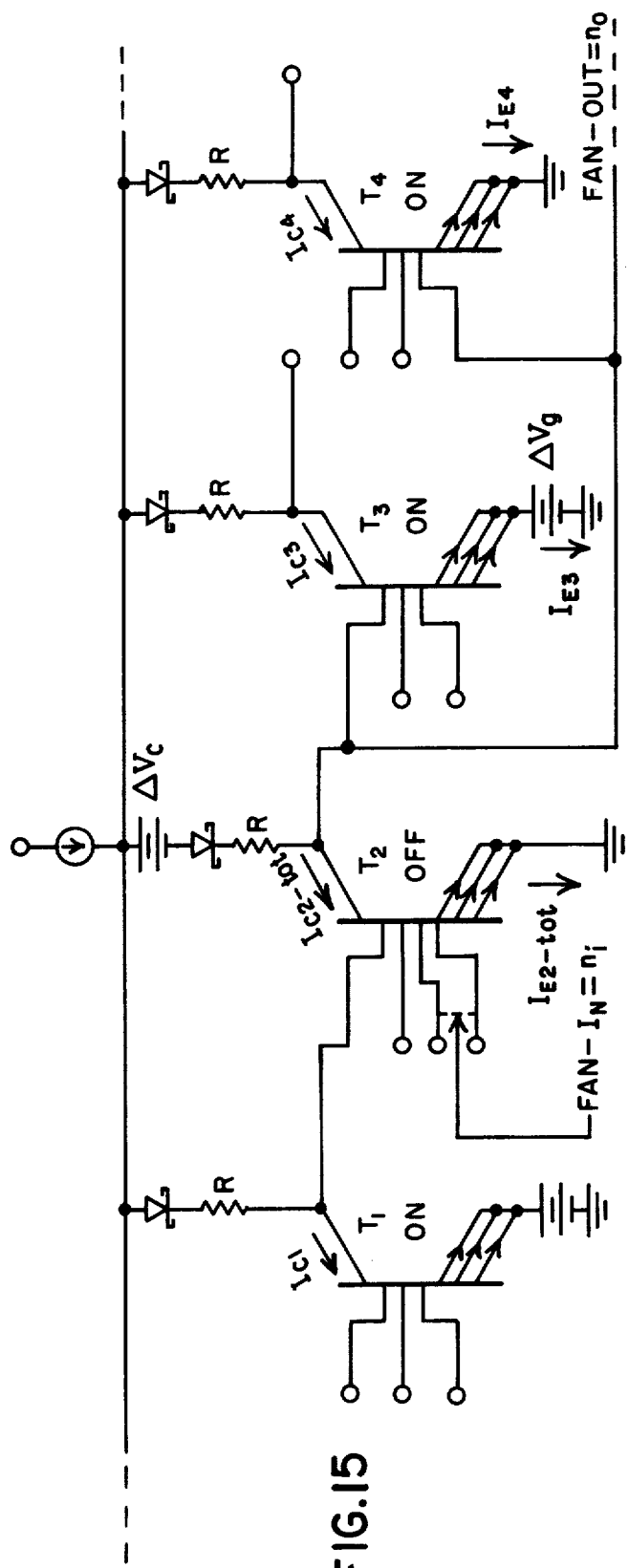
FIG. 15 shows a logic gate system for analysis.

Turning to FIG. 15, the same logic gate arrangement is shown there as was shown in FIG. 6C for a similar analysis. The differences occur in the logic gate circuits in that the Schottky diodes in parallel with the collector load resistors in FIG. 6C have been eliminated, and instead, there are Schottky diodes in series with collector load resistors in FIG. 15 corresponding to the logic gate circuits of FIGS. 14. The same assumptions are made for the FIG. 15 analysis as for the FIG. 6C analysis insofar as assuming the worst case conditions and the problem again is to determine the value of resistance R for the collector load resistors in the logic gates containing transistors $T_1$ through $T_4$ to ensure that the current $I_{C3}$ is sufficient to operate subsequent logic gates fanning out from the collector of transistor $T_3$.

Once again, a first equation concerning the circuit of FIG. 15 can be written by noting that the voltage across the collector circuit for transistor $T_1$ plus the voltage across the pertinent base-emitter junction of transistor $T_2$ must equal the voltage across the collector circuit of transistor $T_2$ and the pertinent base-emitter junction and emitter circuit of transistor $T_3$. This results in the following equation.

$$\frac{kT}{q} \ln \frac{I_{C1}}{I_{DS}} + I_{C1}R + \frac{kT}{q} \ln \frac{\frac{I_{E2-tot}}{n_i}}{\frac{I_{ES-tot}}{n_i}} =$$

$$\Delta V_c + \frac{kT}{q} \ln \left( \frac{I_{C2-tot} + n_o \frac{I_{C4}}{\beta}}{I_{DS}} \right) + RI_{C2-tot} +$$

$$n_o \frac{I_{C4}}{\beta} R + \frac{kT}{q} \ln \frac{I_{E3}}{I_{ES}} + \Delta V_g.$$

Once again in the above equation, the pertinent base current for the off transistor $T_2$ has been approximated as being zero insofar as its effect in the collector circuit of $T_1$ and the base current for transistor $T_3$ has been approximated to be that of the other fan-out transistors for purposes of a worst case analysis. Contrary to the analysis accompanying FIG. 6C, the Schottky diodes in the collector load circuits of both transistors $T_1$ and $T_2$ must be explicitly taken into account which is done by the use of the standard diode equation which assumes that the Schottky diode has a reverse saturation current of $I_{DS}$. Also, there will be a difference in the threshold voltages between the Schottky diodes appearing in the collector circuits of transistors $T_1$ and $T_2$ which is lumped into the battery represented by the symbol $\Delta V_c$ appearing in the collector circuit of transistor $T_2$.

As before, the foregoing equation can be written in a more convenient form by noting the following relationships based on well-known current constraints for a bipolar transistor, $$I_{E2-tot} = n_i I_B + I_{C2-tot} = \frac{I_{C2-tot}}{\beta} + I_{C2-tot} = I_{C2-tot}(\frac{\beta+1}{\beta}),$$

$$I_{E3} = I_{B3} + I_{C3} = \frac{I_{C3}}{\beta} + I_{C3} = I_{C3}(\frac{\beta+1}{\beta}).$$

Similarly, $I_{E4} = I_{C4}(\beta+1/\beta)$. The base-emitter junctions in multiple-base transistor $T_2$ are assumed to be relatively closely matched so that the individual currents of these bases are equal, that is, each collector current and base current into each base region and each emitter current out of each emitter region are, correspondingly for each kind, equal to one another, including the reverse saturation currents associated with each base-emitter junction. Hence, the reverse saturation current $I_{ES}$ for each base-emitter junction can be written $I_{ES} = I_{ES-tot}/n_i$.

The first equation in this analysis can then be rewritten as follows:

$$\frac{kT}{q} \ln \frac{I_{C1}}{I_{DS}} + I_{C1}R + \frac{kT}{q} \ln \frac{\frac{I_{C2-tot}}{n_i}}{I_{ES}} (\frac{\beta+1}{\beta})$$

$$\Delta V_c + \frac{kT}{q} \ln (\frac{I_{C2-tot} + n_o \frac{I_{C4}}{\beta}}{I_{DS}}) + \frac{I_{C1}R \, I_{C2-tot}}{I_{C1}} +$$

$$n_o \frac{I_{C4}}{\beta} R + \frac{kT}{q} \ln \frac{I_{C3}}{I_{ES}} (\frac{\beta+1}{\beta}) + \Delta V_g.$$

Once again, the propagation criteria is to require that the collector current in transistor $T_3$ equals the collector current in transistor $T_1$, $I_{C3} = I_{C1}$. Introducing this criteria into the last equation results after some rearrangement in the following:

$$I_{C1}R - I_{C1}R \frac{I_{C2-tot}}{I_{C1}} - \frac{n_o}{\beta} I_{C4}R = \frac{kT}{q} \ln (\frac{I_{C1}}{\frac{I_{C2-tot}}{n_i}}) +$$

$$\frac{kT}{q} \ln (\frac{I_{C2-tot}}{I_{C1}} + \frac{n_o}{\beta} \frac{I_{C4}}{I_{C1}}) + \Delta V_c + \Delta V_g =$$

$$\frac{kT}{q} \ln (n_i + \frac{n_o}{\beta} \frac{I_{C4}}{\frac{I_{C2-tot}}{n_i}}) + \Delta V_c + \Delta V_g.$$

The second condition for the circuit of FIG. 15 is that the voltage drop across the base-emitter circuits in each of the fan-out transistors be equal. This condition again leads to $$\frac{kT}{q} \ln \frac{I_{E4}}{I_{ES}} = \frac{kT}{q} \ln \frac{I_{E3}}{I_{ES}} + \Delta V_g.$$

This is the same equation as written in the analysis connected with FIG. 6C and by the same steps the following equation results:

$$I_{C4} = I_{C1} \exp(q\Delta V_g/kT).$$

Substituting this last equation into the finally rewritten version of the equation above encompassing the first condition in the circuit of FIG. 15, the following expression results:

$$I_{C1}R = \frac{\frac{kT}{q} \ln (n_i + \frac{n_o}{\beta} \frac{I_{C1}}{\frac{I_{C2-tot}}{n_i}} \exp \frac{q\Delta V_g}{kT}) + \Delta V_c + \Delta V_g}{1 - \frac{I_{C2-tot}}{I_{C1}} - \frac{n_o}{\beta} \exp \frac{q\Delta V_g}{kT}}.$$

The same worst case ratio value for the ratio $I_{C1}/I_{C2-tot}$ can be used as was used in connection with the analysis of the circuit of FIG. 6C as is true for the worst case values of $\Delta V_g$ and $kT/q$. The value of $\Delta V_c$ must be increased to 25 mV to account for the aformentioned added term to be lumped therein, that is, the mismatch of the threshold voltages of the Schottky diodes in the collector circuits of FIG. 15. Again, for a choice of fan-in and fan-out levels ($n_i$ and $n_o$) the above equation can be solved for $I_{C1}R$. This may be substituted into the final version of the equation above which expresses the second condition concerning the circuit of FIG. 15 multiplied through by R, $$I_{C4}R = I_{C1}R \exp(q\Delta V_g/kT),$$

to again provide approximately the minimum voltage change required across the load resistors in the collector circuits of the transistors of FIG. 15. Once more, a choice of a value of the current to be supplied on the average to a logic gate allows a value of R to be calculated from this last equation. A typical value for fan-in and fan-out levels of 5 each might be 300Ω.

For the logic gate circuits of FIGS. 14, rapid switching operation is improved in two ways by keeping the collector load resistor as small in resistance value as possible (the total resistance on the chip using the circuits of FIGS. 14 will be less then that using the circuit of FIG. 1 or of the old DCTL logic family, in any event, for the same reasons stated in connection with FIGS. 2). First, a smaller valued collector load resistor means smaller time constants in charging the stray capacitances associated with the circuit, capacitances which must be charged through the collector load resistors. Further, for the circuits of FIGS. 10, there is a second reason in that too large a value for the collector load resistors will permit saturation of the transistors used in the logic gates of these circuits leading to slow switching operation. The steps which can be taken to keep the resistance values of the collector load resistors relatively small are those mentioned in connection with the logic gates of FIGS. 2 with one addition.

This one addition is the option of using a series pair of diodes as the collector loads or, equivalently, using a diode having a factor greater than n=1 in the commonly used diode equation. This diode equation can be written more fully as follows:

$$I = I_{DS}(\exp \frac{qV}{nkT} - 1).$$

For pn junction diodes and the usual Schottky diode, the factor n is approximately 1 and so, often is not written in equations describing these devices. However, the factor is something other than 1 for some kinds of diodes and this would lead to a diode having a higher voltage swing across it (for n>1) to help ensure logic signal propagation down a cascade of logic gates (as does having a pair of series diodes as a collector load). However, it must be recognized that increasing the voltage swing of the collector circuit will reduce the switching rapidity of the logic gate circuit negating to some extent the reduction of the collector resistor value.

Again, the logic gate circuits of the type shown in FIGS. 10 or 14 are better able to avoid the "current-hogging" problem than is the old DCTL logic family without resorting to emitter or base resistors. This can again be seen by a comparison between a logic gate system using the old DCTL logic family with Schottky transistors and a similar system using the logic gate circuits of FIGS. 14. Much the same results are obtained in such an analysis as are obtained in the analysis made in connection with FIGS. 6A and 6B, again for the reason that less voltage is dropped across the collector resistors in the logic gates of FIGS. 14 than in the DCTL logic family collector resistors.

Figure 16:
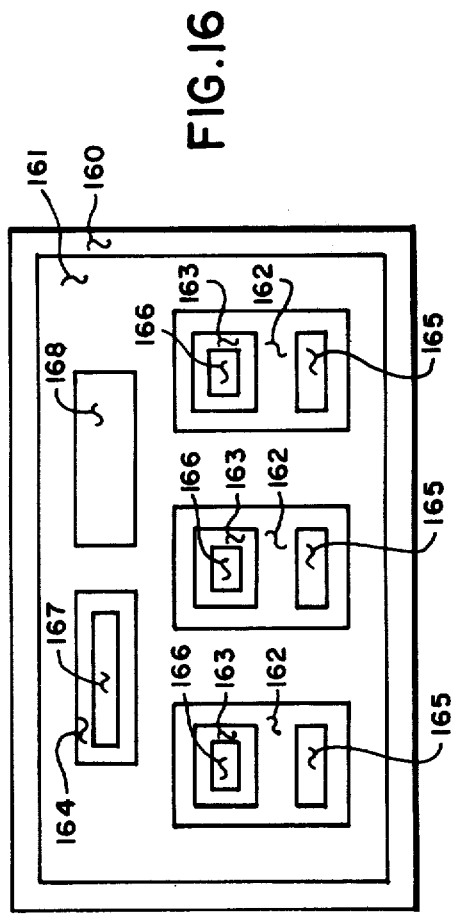
FIG. 16 shows another monolithic integrated circuit embodiment of the invention.

Turning to FIG. 16, there is shown a monolithic integrated circuit version of the logic gate circuit of FIG. 10A or 14A. Again, an n-type conductivity epitaxial silicon layer is provided into which an isolating region, 160, of p-type conductivity is diffused to form an n-type conductivity isolated region, 161, in the epitaxial layer. Three p-type conductivity bases, 162, are provided by diffusion or by ion implantation. Thereafter, there is formed simultaneously the emitters, 163, and the collector contact diffusion 164. Cuts are provided in an insulating layer occurring over the epitaxial layer for making interconnections in the manner heretofore indicated. Thus, there are cuts for the base connections, 165, and cuts for emitter interconnections, 166. A collector contact cut, 167, is provided. Finally, a cut for a Schottky diode, 168, is shown. Should further series resistance be required in the collector circuit beyond what can be provided inherently in the Schottky diode, the Schottky diode cut could be provided beyond collector contact cut 167 on the side thereof away from bases 162 so a portion of isolated region 161 serves as an epitaxial layer resistor.

Figure 17:
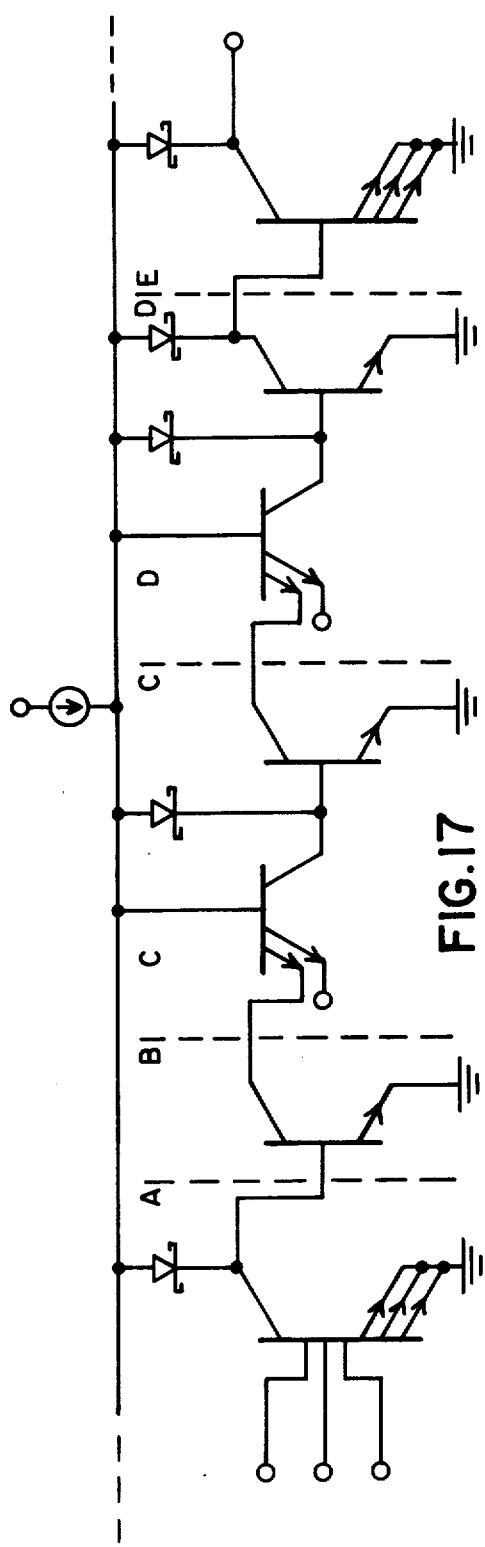
FIGS. 17 and 18 show logic gate systems combining various kinds of logic gate circuits of the invention.

The logic gate circuits of FIGS. 10 (or FIGS. 14) can be used with some other logic gate circuits which also use Schottky diode loads. Thus, FIG. 17 shows a cascade of logic gates separated by vertical dashed lines. The first logic gate to the left, logic gate A, uses just the logic gate circuit shown in FIG. 10A. Logic gate A in turn drives an open-collector transistor inverter, logic gate B. This logic gate needs no load because of the nature of the subsequent logic gate driven by logic gate B, that is, logic gate C.

Logic gate C performs the NAND logic function through use of a first multiple-emitter transistor having a Schottky diode load. This combination drives another open-collector transistor serving as the output transistor for logic gate C. Hence, logic gate C consumes more space in the monolithic integrated circuit than does either of logic gates A or B because of the need for two transistors. Nevertheless, the convenient performance of the NAND logic function makes logic gate C useful on occasion. There is, of course, a parallel between the operation of logic gate C and the ordinary TTL logic gate.

Logic gate C drives another logic gate like itself, logic gate D. The only difference between logic gates D and C is that the former adds a Schottky diode load in the collector circuit of the output transistor to enable the logic gate D to drive the final logic gate in the cascade, logic gate E. Logic gate E is again a logic gate of the type shown in FIG. 10A.

Figure 18:
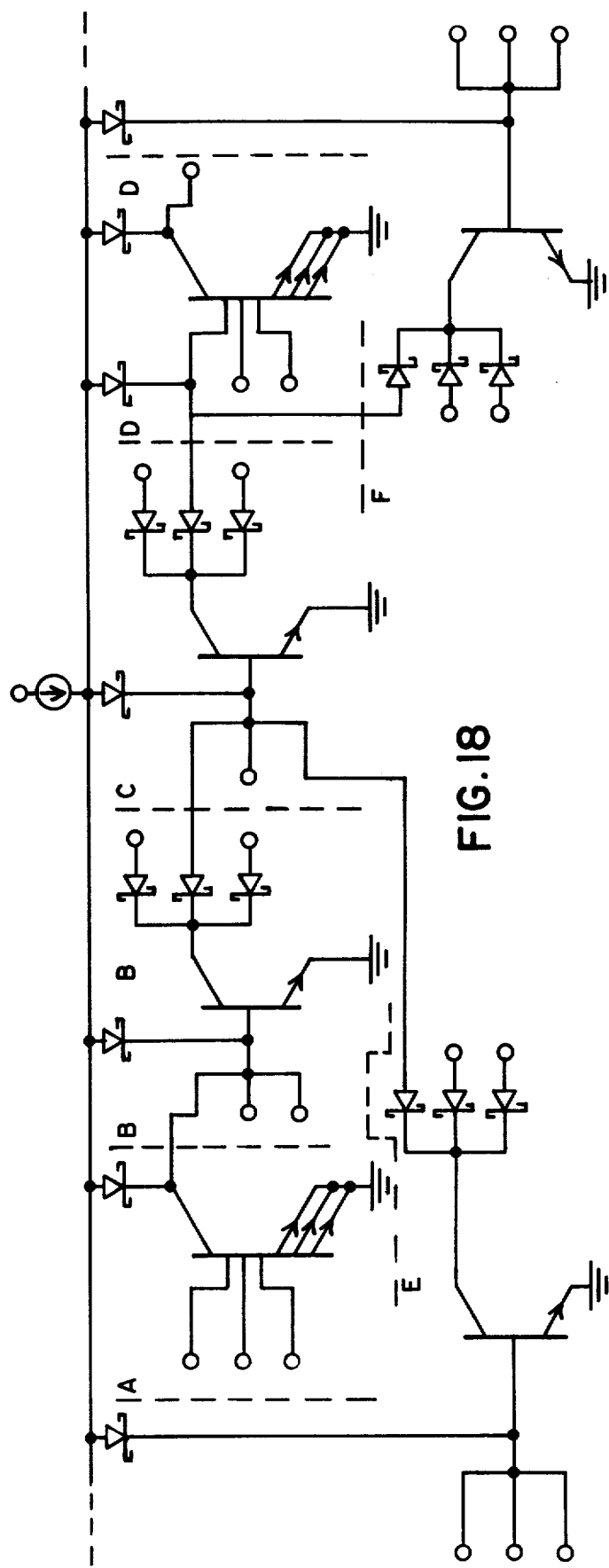

Another kind of logic gate, also using Schottky diode loads, which may have occasional usefulness is shown in FIG. 18. Again, the logic gate circuit of the first logic gate shown in the long cascade of logic gates, logic gate A, is just a logic gate circuit of the kind shown in FIG. 10A. This circuit drives a subsequent logic gate, logic gate B, which is an inverter having three coupling Schottky diodes in the collector of the transistor used in that inverter. Also, a Schottky diode is shown in the base of the transistor in logic gate B which would normally provide a load for the preceding logic gate were these logic gates the same kind as logic gate B. This diode could be omitted here since logic gate A has its own diode load. The provision of the coupling Schottky diodes in the collector of the transistor in logic gate B permits performing the DOT-AND logic function with parallel logic gates of the same type, including the parallel logic gate shown which is designated logic gate E, at the input of the next logic gate in the long cascade, logic gate C. The logic gate circuits for logic gates C and E are just like the circuit for logic gate B.

Another logic gate, logic gate F, also using the logic gate circuit of logic gate B, is used in parallel with logic gate C to again perform the DOT-AND logic function at the input of the next logic gate driven by logic gate C in the long cascade, that is, logic gate D. Logic gate D uses the logic gate circuit of FIG. 10A with the exception of adding a Schottky diode load in the base lead where the DOT-AND logic function is performed to provide a load for logic gates C and F.

The embodiments of the invention in which an exclusive property or right is claimed are defined as follows:

1. A monolithic integrated circuit provided in a semiconductor material for performing logical functions including a NOR function, said integrated circuit comprising:

a plurality of electrically isolated regions of said semiconductor material, each of a first conductivity type, including both first and second isolated regions;

a first base region of a second conductivity type located entirely within said first isolated region, there being a first base junction between said first base region and said first isolated region;

a second base region of said second conductivity type located entirely within said second isolated region, there being a second base junction between said second base region and said second isolated region;

a first emitter region of said first conductivity type located entirely within said first base region;

a second emitter region of said first conductivity type located entirely within said second base region;

a first plurality of ohmic base contacts each made to a base region located entirely within said first isolated region and made by a first base interconnection lead means, said first base interconnection lead means being capable of transmitting signals from a source of signals and including a first base contact made to said first base region;

an ohmic second base contact, in addition to said first plurality of ohmic base contacts, made to a base region located entirely within said second isolated region and made by a second base interconnection lead means, said second base interconnection lead means being capable of transmitting signals from a source of signals;

an emitter region of said first conductivity type located entirely within each base region contacted by said first plurality of ohmic base contacts, including said first emitter region;

an ohmic emitter contact made to each emitter region located in a base region contacted by said first plurality of ohmic base contacts, including a first emitter contact made to said first emitter region, by a first energy supply interconnection lead means adapted for energization by a current source;

an ohmic second emitter contact made to said second emitter region by said first energy supply interconnection lead means;

an ohmic first collector contact made to said first isolated region by a first signal interconnection lead means such that there is a direct electrical connection between said first signal interconnection lead means and said second base interconnection lead means;

an ohmic second collector contact made to said second isolated region by a second signal interconnection lead means;

a rectifying third collector contact made to said first isolated region by a second energy supply interconnection lead means adapted for energization by said current source; and a rectifying fourth collector contact made to said second isolated region by said second energy supply interconnection lead means such that a direct electrical connection occurs along said second energy supply interconnection lead means between said third and fourth rectifying contacts.

2. The apparatus of claim 1 wherein a first resistive means is provided between said second energy supply interconnection lead means and said first signal interconnection lead means to thereby introduce a significant resistance between said second energy supply interconnection lead means and said first signal interconnection lead means.

3. The apparatus of claim 1 wherein there is a plurality of base regions of said second conductivity type which are located entirely within said first isolated region, including said first base region, there being a plurality of base junctions such that each of said plurality of base junctions is between one of said plurality of base regions and said first isolated region, including said first base junction; and a plurality of emitter regions each being of said first conductivity type with each of said plurality of emitter regions being located entirely within the corresponding one of said plurality of base regions, including said first emitter region.

4. The apparatus of claim 1 wherein a third isolated region of said plurality of isolated regions includes at least a portion of said current source which is electrically connected to said second energy supply interconnection lead means and which has ohmic contact made thereto by a first voltage supply interconnection lead means adapted for energization by a first voltage source.

5. The apparatus of claims 2 wherein a third isolated region of said plurality of isolated regions includes at least a portion of said current source which is electrically connected to said second energy supply interconnection lead means and which has ohmic contact made thereto by a first voltage supply interconnection lead means adapted for energization by a first voltage source.

6. The apparatus of claim 2 wherein said first resistive means is provided by a portion of said semiconductor material of said first conductivity type in said first isolated region.

7. The apparatus of claim 2 wherein said first resistive means is provided by a resistor region of said second conductivity type located entirely within said first isolated region, there being a resistor junction between said resistive region and said first isolated region.

8. The apparatus of claim 6 wherein said portion of said semiconductor material has a part thereof adjacent to said rectifying third collector contact with an ohmic first resistor contact being made to another part of said portion of said semiconductor material by said second energy supply interconnection lead means.

9. The apparatus of claim 7 wherein an ohmic first resistor contact is made to said resistor region by said first signal interconnection lead means and an ohmic resistor contact is made to said resistor region by said second energy supply interconnection lead means.

10. The apparatus of claim 8 wherein there is a plurality of base regions of said second conductivity type which are located entirely within said first isolated region, including said first base region, there being a plurality of base junctions such that each of said plurality of base junctions is between one of said plurality of base regions and said first isolated region, including said first base junction; and a plurality of emitter regions each being of said first conductivity type with each of said plurality of emitter regions being located entirely within the corresponding one of said plurality of base regions, including said first emitter region.

11. The apparatus of claim 9 wherein there is a plurality of base regions of said second conductivity type which are located entirely within said first isolated region, including said first base region, there being a plurality of base junctions such that each of said plurality of base junctions is between one of said plurality of base regions and said first isolated region, including said first base junction; and a plurality of emitter regions each being of said first conductivity type with each of said plurality of emitter regions being located entirely within the corresponding one of said plurality of base regions, including said first emitter region.

12. The apparatus of claim 4 wherein said current source portion is a resistive means and has an ohmic contact made thereto by said second energy supply interconnection lead means.

13. The apparatus of claim 5 wherein said current source portion is a resistive means and has an ohmic contact made thereto by said second energy supply interconnection lead means.

14. A circuit for performing logical functions including a NOR function, said circuit comprising:
a first gate circuit comprising:

a plurality of first bipolar transistors, including a first bipolar transistor, each having a collector, an emitter and at least one base therein such that said collector and said base in each are separated by a collector-base semiconductor junction and such that said emitter and said base in each are separated by an emitter-base semiconductor junction, said first plurality bipolar transistor collectors being in direct electrical contact with one another, said first plurality bipolar transistor emitters being in direct electrical contact with one another, said first bipolar transistor emitter being directly electrically connected to a first terminal means adapted for electrical connection to a current source and said first bipolar transistor base being an input to receive signals from sources of signals; and a first rectifying diode means having a current rectification capability between a pair of electrical termination regions therein with one of said electrical termination regions being electrically connected to said first bipolar transistor collector so that any current, flowing in a forward direction through said first rectifying diode means and jointly flowing in said first bipolar transistor collector and emitter, flows in said first bipolar transistor in a reverse direction across said collector-base junction thereof and in a forward direction across said emitter-base junction thereof, and with that remaining one of said first rectifying diode means electrical termination regions being electrically connected to a second terminal means adapted for connection to said current source, whereby a logic gate circuit capable of performing said NOR function is provided with said first transistor collector serving as an output for said first gate circuit;

a second gate circuit comprising:

a second bipolar transistor having a collector, an emitter and at least one base therein such that said collector and said base are separated by a collector-base semiconductor junction and such that said emitter and said base are separated by an emitter-base semiconductor junction, said second bipolar transistor emitter being directly electrically connected to said first terminal means and said second bipolar transistor base being an input to receive signals from sources of signals; and a second rectifying diode means having a current rectification capability between a pair of electrical termination regions therein with one of said electrical termination regions being electrically connected to said second bipolar transistor collector so that any current, flowing in a forward direction through said second rectifying diode means and jointly flowing in said second bipolar transistor collector and emitter, flows in said second bipolar transistor in a reverse direction across said collector-base junction thereof and in a forward direction across said emitter-base junction thereof, and with that remaining one of said second rectifying diode means electrical termination regions being electrically connected to said second terminal means, there being a direct electrical connection between said first and second rectifying diode means along said second terminal means; and a direct electrical connection between said first gate circuit output and said second gate circuit input.

15. The apparatus of claim 14 wherein a first resistor is directly electrically connected in parallel with said first rectifying diode means.

16. The apparatus of claim 14 wherein a first resistor is connected in series with said first rectifying diode means.

17. The apparatus of claim 14 wherein said first rectifying diode means is directly electrically connected between said first bipolar transistor collector and said second terminal means.

18. The apparatus of claim 14 wherein said first and second rectifying diode means are Schottky diodes.

19. The apparatus of claim 15 wherein said first rectifying diode means is a Schottky diode.

20. The apparatus of claim 16 wherein said first rectifying diode means is a Schottky diode and said first resistor is provided by an effective resistance occurring in said Schottky diode.

21. The apparatus of claim 17 wherein said first rectifying diode means is a Schottky diode.

22. The apparatus of claim 17 wherein a first resistor is directly electrically connected in parallel with said first rectifying diode means.

23. The apparatus of claim 19 wherein at least a portion of said current source is provided connected to said second terminal means and wherein said current source portion has an electrical contact means in electrical contact therewith adapted for connection to a voltage source.

24. The apparatus of claim 20 wherein at least a portion of said current source is provided connected to said second terminal means and wherein said current source portion has an electrical contact means in electrical contact therewith adapted for connection to a voltage source.

25. The apparatus of claim 21 wherein at least a portion of said current source is provided connected to said second terminal means and wherein said current source portion has an electrical contact means in electrical contact therewith adapted for connection to a voltage source.

26. The apparatus of claim 22 wherein said first rectifying diode means is a Schottky diode.

27. The apparatus of claim 26 wherein at least a portion of said current source is provided connected to said second terminal means and wherein said current source portion has an electrical contact means and electrical contact therewith and adapted for connection to a voltage source.

28. A circuit for performing logical functions including a NAND function, said circuit comprising:

a first gate circuit comprising:

a first multiple-emitter bipolar transistor having a collector, a base and a plurality of emitters therein such that said collector and said base are separated by a collector-base semiconductor junction and such that each of said emitters and said base are separated by an emitter-base semiconductor junction, said first multiple-emitter transistor base being electrically connected to a first terminal means adapted for connection to a current source and said first multiple-emitter transistor emitters being inputs to receive signals from sources of signals;

a first rectifying diode means having a current rectification capability between a pair of electrical termination regions therein with one of said electrical termination regions being electrically connected to said first multiple-emitter transistor collector so that any current, flowing in a forward direction through said first rectifying diode means and jointly flowing in said first multiple-emitter bipolar transistor collector and an emitter, flows in said first multiple-emitter bipolar transistor in a reverse direction across said collector-base junction thereof and in a forward direction across at least one of said emitter-base junctions thereof, and with that remaining one of said first rectifying diode means electrical termination region being electrically connected to said first terminal means; and a first output bipolar transistor having a collector, a base and an emitter therein, said first output bipolar transistor emitter being directly electrically connected to a second terminal means adapted for connection to said current source and said first output bipolar transistor base being electrically connected to said first multiple-emitter transistor collector, whereby a logic circuit capable of performing a NAND function is provided with said first output transistor collector serving as an output for said first gate circuit;

a second gate circuit comprising:

a first base input bipolar transistor having a collector, an emitter and at least one base therein such that said collector and said base are separated by a collector-base semiconductor junction and such that said emitter and said base are separated by an emitter-base semiconductor junction, said first base input bipolar transistor emitter being directly electrically connected to said second terminal means, and said first base input bipolar transistor base being an input to receive signals from sources of signals with said first base input bipolar transistor collector serving as an output; and a second rectifying diode means having a current rectification capability between a pair of electrical termination regions therein with one of said electrical termination regions being electrically connected to said first base input bipolar transistor collector so that any current, flowing in a forward direction through said second rectifying diode means and jointly flowing in said first base input bipolar transistor collector and emitter, flows in said first base input bipolar transistor in a reverse direction across said collector-base junction thereof and in a forward direction across said emitter-base junction thereof, and with that remaining one of said second rectifying diode means electrical termination regions being electrically connected to said first terminal means, there being a direct electrical connection between said first and second rectifying diode means along said first terminal means, whereby another logic gate circuit capable of performing a NOR function is provided; and a direct electrical connection between a selected one of said output and said input of said second gate circuit and a selected one of said output and said inputs of said first gate circuit.

29. The apparatus of claim 28 wherein a third gate circuit is also provided, said third gate circuit comprising:

a second multiple-emitter bipolar transistor having a collector, a base and a plurality of emitters therein such that said collector and said base are separated by a collector-base semiconductor junction and such that each of said emitters and said base are separated by an emitter-base semiconductor junction, said second multiple-emitter transistor base being connected to said first terminal means and said second multiple-emitter transistor emitters being inputs to receive signals from sources of signals;

a third rectifying diode means having a current rectification capability between a pair of electrical termination regions therein with one of said electrical termination regions being electrically connected to said second multiple-emitter transistor collector so that any current, flowing in a forward direction through said third rectifying diode means and jointly flowing in said second multiple-emitter bipolar transistor collector and an emitter, flows in said second multiple-emitter transistor in a reverse direction across said collector-base junction thereof and in a forward direction across at least one of said emitter-base junctions thereof, and with that remaining one of said third rectifying diode means electrical termination regions being electrically connected to said first terminal means;

a second output bipolar transistor having a collector, a base and an emitter therein, said second output bipolar transistor emitter being directly electrically connected to said second terminal means and said second output bipolar transistor base being electrically connected to said second multiple-emitter transistor collector, whereby another logic gate circuit capable of performing an NAND function is provided with said second output bipolar transistor collector serving as an output for said third gate circuit; and a direct electrical connection between said first gate circuit output and one of said inputs of said third gate circuit.

30. The apparatus of claim 29 wherein said first, second and third rectifying diode means are first, second and third Schottky diodes, respectively.

31. A circuit for performing logical functions including an inversion function suitable for performing a DOT-AND function, said circuit comprising:

a first gate circuit comprising:

a first bipolar transistor having a collector, a base and an emitter therein such that said collector and said base are separated by a collector-base semiconductor junction and such that said emitter and said base are separated by an emitter-base semiconductor junction, said first bipolar transistor emitter being directly electrically connected to a first terminal means adapted for connection to a current source and said first bipolar transistor base being an input to receive signals from sources of signals;

a first rectifying diode means having a current rectification capability between a pair of electrical termination regions therein with one of said electrical termination regions being electrically connected to said first bipolar transistor base so that any current, flowing in a forward direction through said first rectifying diode means and jointly flowing in said first bipolar transistor base and emitter, flows in said first bipolar transistor in a forward direction across said emitter-base junction thereof, and with that remaining one of said first rectifying diode means electrical termination regions being electrically connected to a second terminal means adapted for connection to said current source; and a second rectifying diode means having a current rectification capability between a pair of electrical termination regions therein with one of said electrical termination regions being electrically connected to said first bipolar transistor collector so that any current, flowing in a forward direction through said second rectifying diode means and jointly flowing in said first bipolar transistor collector and emitter, flows in said first bipolar transistor in a reverse direction across said collector-base junction thereof and in a forward direction across said emitter-base junction thereof, and with that remaining one of said second rectifying diode means electrical termination regions serving as an output for said first gate circuit, whereby a logic circuit capable of performing inverter functions suitable for performing a DOT-AND function is provided.

32. The apparatus of claim 31 wherein a second gate circuit is also provided, said second gate circuit comprising:

a second bipolar transistor having a collector, a base and an emitter therein such that said collector and said base are separated by collector-base semiconductor junction and such that said emitter and said base are separated by an emitter-base semiconductor junction, said second bipolar transistor emitter being directly electrically connected to said first terminal means and said second bipolar transistor base being an input to receive signals from sources of signals;

a third rectifying diode means having a current rectification capability between a pair of electrical termination regions therein with one of said electrical termination regions being electrically connected to said second bipolar transistor base so that any currents, flowing in a forward direction through said third rectifying diode means and jointly flowing in said second bipolar transistor base and emitter flows in said second bipolar transistor in a foward direction across said emitter-base junction thereof, and with that remaining one of said third rectifying diode means electrical termination regions being electrically connected to said second terminal means, there being a direct electrical connection between said first and third rectifying diode means along said second terminal means;

a fourth rectifying diode means having a current rectification capability between a pair of electrical termination regions therein with one of said electrical termination regions being electrically connected to said second bipolar transistor collector so that any current, flowing in a forward direction through said fourth rectifying diode means and jointly flowing in said second bipolar transistor collector and emitter, flows in said second bipolar transistor in a reverse direction across said collector-base junction thereof and in a forward direction across said emitter-base junction thereof, and with that remaining one of said fourth rectifying diode means electrical termination regions serving as an output for said second gate circuit, whereby another logic circuit capable of performing an inverter function suitable for performing a DOT-AND function is provided; and a direct electrical connection between said first gate circuit output and said second gate circuit input.

33. The apparatus of claim 31 wherein a second gate circuit is also provided, said second gate circuit comprising:

a second bipolar transistor having a collector, an emitter and at least one base therein such that said collector and said base are separated by a collector-base semiconductor junction and such that said emitter and said base are separated by an emitter-base semiconductor junction, said second bipolar transistor emitter being directly electrically connected to said first terminal means and said second bipolar transistor base being an input to receive signals from sources of signals with said second transistor collector serving as an output;

a third rectifying diode means having a current rectification capability between a pair of electrical termination regions therein with one of said electrical termination regions being electrically connected to said second bipolar transistor collector so that any currents, flowing in a forward direction through said third rectifying diode means and jointly flowing in said second bipolar transistor collector and emitter, flows in said second bipolar transistor in a reverse direction across said collector-base junction thereof and in a forward direction across said emitter-base junction thereof, and with that remaining said third rectifying diode means electrical termination region being electrically connected to said second terminal means, there being a direct electrical connection between said first and third rectifying diode means along said second terminal means, whereby another logic gate circuit capable of performing a NOR function is provided; and a direct electrical connection between a selected one of said input and said output of said second gate circuit and a selected one of said input and said output in said first gate circuit.

34. The apparatus of claim 31 wherein said first and second rectifying diode means are first and second Schottky diodes, respectively.

* * * * *